(12) United States Patent
    Kuo

(10) Patent No.: US 12,656,547 B2
(45) Date of Patent: Jun. 16, 2026

(54) SEMICONDUCTOR PACKAGE STRUCTURE AND METHOD OF FABRICATING THE SAME

(71) Applicant: Taiwan Semiconductor Manufacturing Company, Ltd., Hsinchu (TW)

(72) Inventor: Feng-Wei Kuo, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 479 days.

(21) Appl. No.: 18/311,882

(22) Filed: May 3, 2023

(65) Prior Publication Data

US 2024/0369765 A1     Nov. 7, 2024

(51) Int. Cl.

| G02B 6/125 | (2006.01) |
| G02B 6/12 | (2006.01) |
| G02B 6/136 | (2006.01) |
| H10W 20/20 | (2026.01) |
| H10W 70/65 | (2026.01) |
| H10W 70/685 | (2026.01) |
| H10W 72/20 | (2026.01) |
| H10W 72/90 | (2026.01) |
| H10W 74/00 | (2026.01) |
| H10W 74/10 | (2026.01) |
| H10W 90/00 | (2026.01) |
| H10W 90/20 | (2026.01) |

(52) U.S. Cl.
CPC ............ *G02B 6/125* (2013.01); *G02B 6/136* (2013.01); *H10W 20/20* (2026.01); *H10W 70/685* (2026.01); *H10W 74/117* (2026.01);

*H10W 90/00* (2026.01); *G02B 2006/12061* (2013.01); *G02B 2006/12147* (2013.01); *H10W 70/65* (2026.01); *H10W 72/241* (2026.01); *H10W 72/9413* (2026.01); *H10W 72/942* (2026.01); *H10W 74/00* (2026.01); *H10W 90/297* (2026.01); *H10W 90/722* (2026.01)

(58) Field of Classification Search
None
See application file for complete search history.

(56) References Cited

U.S. PATENT DOCUMENTS

| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Shan Liu
(74) *Attorney, Agent, or Firm* — JCIPRNET

(57) ABSTRACT

A semiconductor package is provided. The semiconductor package includes a photonic package that includes an electronic die and a photonic die bonded to each other. The photonic die includes a plurality of waveguides, each laterally surrounded by a respective dielectric layer, and a first redistribution structure disposed over the waveguides and the dielectric layers. At least one of the waveguides includes a meandering portion, the meandering portion includes two straight segments and a bend segment with a gradual curvature.

20 Claims, 21 Drawing Sheets

(56)        References Cited

U.S. PATENT DOCUMENTS

| | | | |
|---|---|---|---|
| 9,735,131 B2 | 8/2017 | Su et al. | |
| 2020/0003950 A1* | 1/2020 | Yu | G02B 6/124 |
| 2021/0088723 A1* | 3/2021 | Yu | G02B 6/12004 |
| 2021/0091056 A1* | 3/2021 | Yu | G02B 6/4214 |
| 2021/0096311 A1* | 4/2021 | Yu | G02B 6/12004 |
| 2022/0043208 A1* | 2/2022 | Hsia | G02B 6/30 |

* cited by examiner

SEMICONDUCTOR PACKAGE STRUCTURE AND METHOD OF FABRICATING THE SAME

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
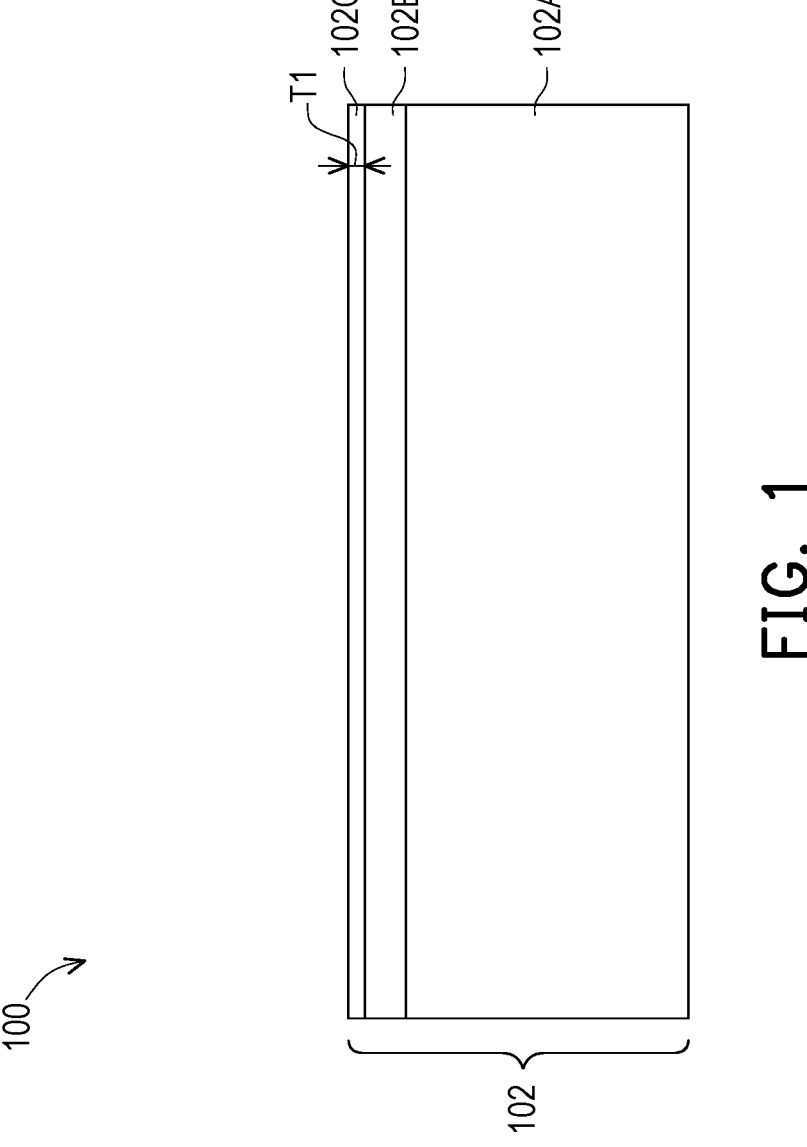
FIG. 1 through FIG. 17 are schematic sectional views at various stages in a method of fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 17 are schematic sectional views at various stages in a method of fabricating a package structure 100 in accordance with some embodiments of the present disclosure. The package structure 100 may be a photonic package and may be part of a semiconductor package (e.g., the semiconductor packages PKG1, PKG2 and PKG3 described below with reference to FIGS. 18-20). In some embodiments, the package structure 100 provides an input/output (I/O) interface between optical signals and electrical signals in a semiconductor package. For example, the package structure 100 facilitates communication between various components (such as photonic devices, integrated circuits, and couplings to external fibers) within the package structure 100, by means of an optical network.

Referring to FIG. 1, a Semiconductor-On-Insulator (SOI) substrate 102 is provided. The SOI substrate 102 includes a substrate 102A, a dielectric layer 102B formed over the substrate 102A, and a grating material layer 102C formed over the dielectric layer 102B. The substrate 102A may be a material such as a glass, ceramic, dielectric, a semiconductor, the like, or a combination thereof. In some embodiments, the substrate 102A may be a semiconductor substrate, such as a bulk semiconductor or the like, which may be doped (e.g., with a p-type or an n-type dopant) or undoped. The substrate 102A may be a wafer, such as a silicon wafer. Other substrates, such as a multi-layered or gradient substrate may also be used. In some embodiments, a material of the substrate 102A includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The dielectric layer 102B may be formed of silicon oxide, and hence is referred to as Buried Oxide (BOX) layer, although it may also be formed of other dielectric materials. In alternative embodiments, the dielectric layer 102B includes non-oxide material such as a silicon-containing dielectric material (e.g., silicon nitride, silicon oxynitride), or the like. In some embodiments, the grating material layer 102C is formed of semiconductor material such as silicon and is formed with a thickness T1 ranging from about 100 nm to about 1000 nm. For example, the thickness T1 of the grating material layer 102C may be greater than 270 nm. In alternative embodiments, the grating material layer 102C is formed of silicon nitride, and the thickness of the silicon nitride grating material layer 102C is in a range of between about 100 nm and about 2000 nm. For example, the thickness of the silicon nitride grating material layer 102C may be greater than 300 nm.

Figure 2:
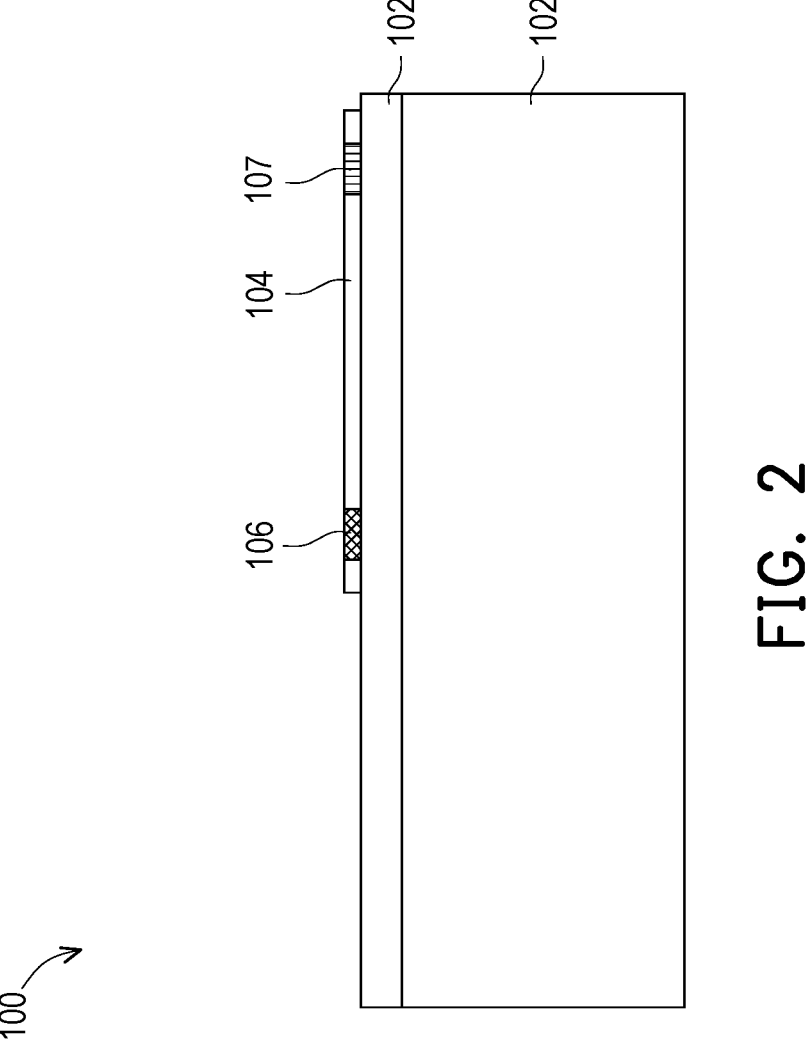

Referring to FIG. 2, the grating material layer 102C is patterned to form regions for waveguides 104, photonic components 106, and grating couplers 107. The grating material layer 102C may be patterned using suitable photolithography and etching techniques. For example, a hard mask layer (not shown) is formed over the grating material layer 102C and then patterned. The pattern of the hard mask layer may then be transferred to the grating material layer 102C using an etching process. The etching process may include a dry etching process and/or a wet etching process. In some embodiments, multiple photolithography and etching sequences may be used to pattern the grating material layer 102C. In some further embodiments, etching depths of the grating material layer 102C range from about 0 nm to about 1000 nm. In certain cases, the etching depths of the grating material layer 102C may be greater than 70 nm. In some alternative embodiments where the grating material layer 102C is formed of silicon nitride, etching depths of the silicon nitride grating material layer 102C range from about 0 nm to about 2000 nm. For example, the etching depths of the silicon nitride grating material layer 102C may be greater than 150 nm.

The grating material layer 102C is etched to form waveguides 104 (also referred to as silicon waveguides) and photonic components 106 and grating couplers 107 integrated to the waveguides 104. In some cases, the waveguides 104, the photonic components 106, and the grating couplers 107 may be collectively referred to as "the photonic layer." Although not explicitly illustrated, one or more waveguides 104 may be formed from the grating material layer 102C. In embodiments where multiple waveguides 104 are formed, the waveguides 104 can be discrete waveguides 104 or a single continuous structure of connected waveguides 104. In some further embodiments, one or more of the waveguides 104 form a continuous loop. For example, the continuous loop of the waveguides 104 may have a meandering shape, and the feature details of which will be described later with reference to FIG. 21.

The photonic components 106 may be formed adjacent to and integrated with the waveguides 104, and may be formed with the silicon waveguides 104. For example, the photonic components 106 is optically coupled to the waveguides 104 to interact with optical signals within the waveguides 104. In some embodiments, the photonic components 106 include photonic devices such as photodetectors and/or modulators. For example, a photodetector may be optically coupled to the waveguides 104 to detect optical signals within the waveguides 104 and generate electrical signals that correspond to the optical signals. On the other hand, a modulator may be optically coupled to the waveguides 104 to receive electrical signals and generate corresponding optical signals within the waveguides 104 by modulating optical power within the waveguides 104. In this manner, the photonic components 106 facilitate the input/output (I/O) of optical signals to and from the waveguides 104. In other embodiments, the photonic components include other active or passive components, such as laser diodes, optical signal splitters, or other types of photonic structures or devices. Optical power may be provided to the waveguides 104 by, for example, an optical fiber (not shown) coupled to an external light source, or the optical power may be generated by a laser diode (not shown).

In some embodiments, the photodetectors are formed by partially etching regions of the grating material layer 102C and epitaxial growing a material on the remaining grating material of the etched regions. The material epitaxial grown on the etched regions may include a semiconductor material such as germanium (Ge), which may be doped or undoped. In some additional embodiments, dopants (e.g., p-type dopants and/or n-type dopants) may be introduced within the remaining grating material of the etched regions through an implantation process. In some other embodiments, the modulators are formed by partially etching regions of the waveguides 104 and then implanting dopants within the remaining grating material of the etched regions.

In addition, one or more grating couplers 107 may be formed adjacent to and integrated with the waveguides 104, and may be formed with the waveguides 104. The grating couplers 107 are photonic structures that allow optical signals and/or optical power to be transferred between the waveguides 104 and a photonic component such as an optical fiber or a waveguide of another photonic system. In some embodiments, the grating couplers 107 are formed using acceptable photolithography and etching techniques. In one embodiment, the grating couplers 107 are formed after the waveguides 104 are defined. For example, the grating couplers 107 are formed by patterning the waveguides 104 to form a plurality of recesses therein, and the recesses of the grating couplers 107 are formed with varying widths and depths.

Figure 14:
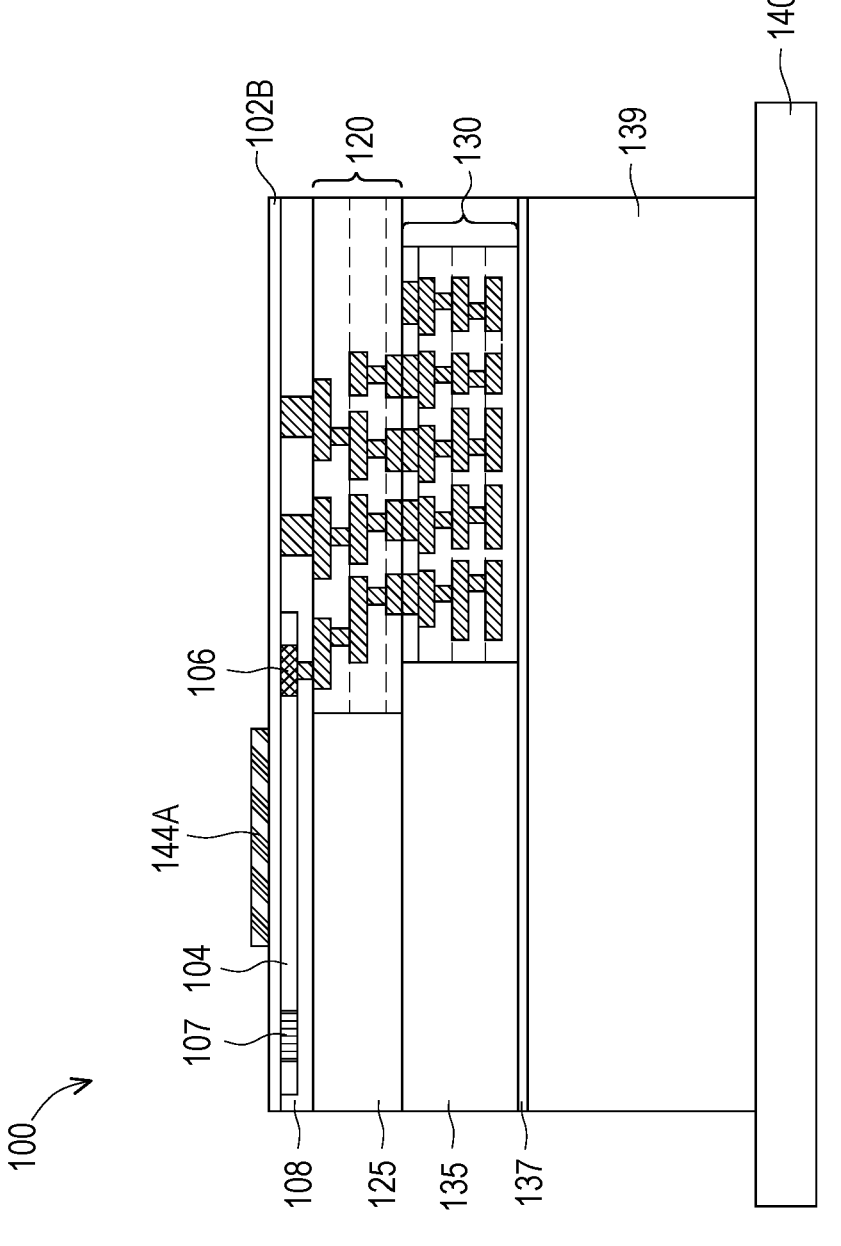

Other types of couplers may be formed, such as a structure that couples optical signals between the waveguides 104 and other waveguides of the package structure 100, such as nitride waveguides (e.g., waveguides 144A shown in FIG. 14). Edge couplers (not explicitly shown) may also be formed that allow optical signals and/or optical power to be transferred between the waveguide 104 and a photonic component that is horizontally mounted near a sidewall of the package structure 100. The above-mentioned photonic structures and other photonic structures are considered within the scope of the present disclosure.

Figure 3:
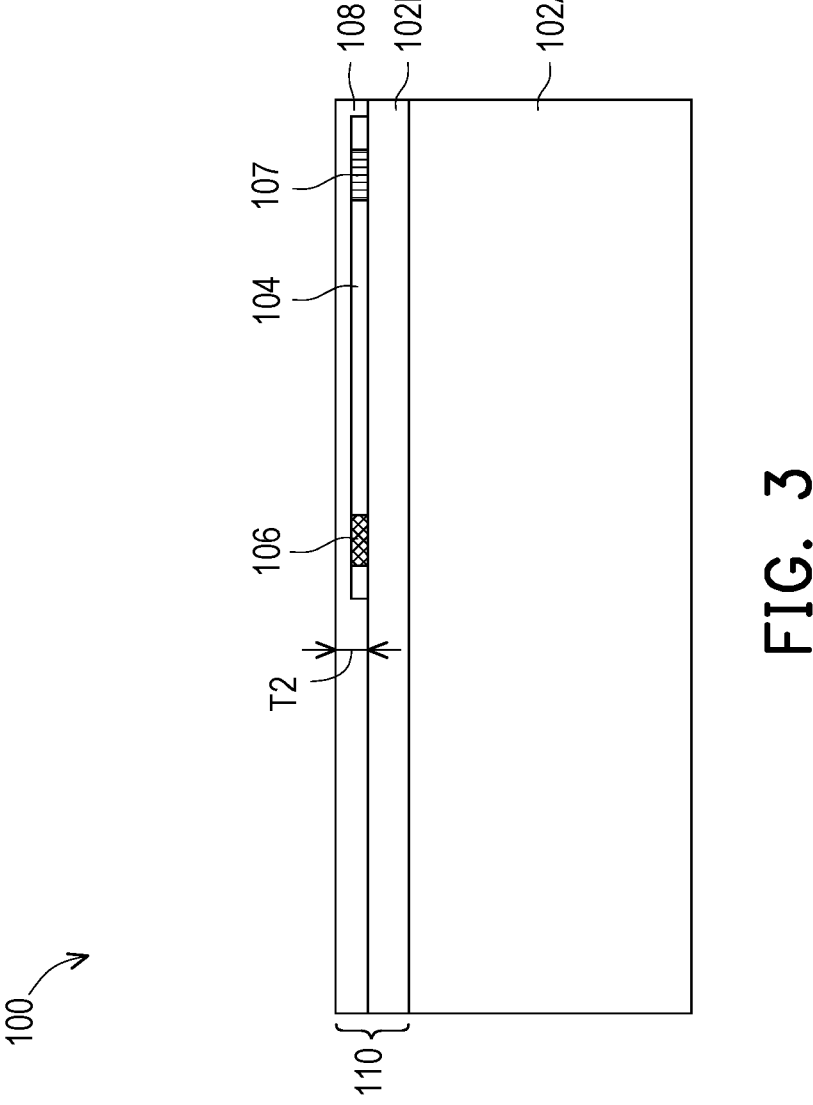

Referring to FIG. 3, a dielectric layer 108 is formed over the photonic layer (i.e., the waveguides 104, the photonic components 106, and the grating couplers 107) to form a photonic routing structure 110. The dielectric layer 108 may be formed of one or more layers of silicon oxide or the like, and may be formed by Chemical Vapor Deposition (CVD), Physical Vapor Deposition (PVD), Atomic Layer Deposition (ALD), spin-on-dielectric process, or a combination thereof. Alternatively, High Density Plasma CVD (HDP-CVD) may be used to form the dielectric layer 108. Other dielectric materials formed by any acceptable process may be used. In some embodiments, a planarization process such as a Chemical Mechanical Polishing (CMP) process or a grinding process is performed after the deposition of the dielectric layer 108. The resulting dielectric layer 108 may have a thickness T2 less than 10 μm and no less than 0 μm. For example, the thickness T2 of the dielectric layer 108 may be greater than 100 nm. In some cases, using a thinner dielectric layer 108 can enhance the effectiveness of optical coupling between a photonic component and a grating coupler 107.

Figure 4:
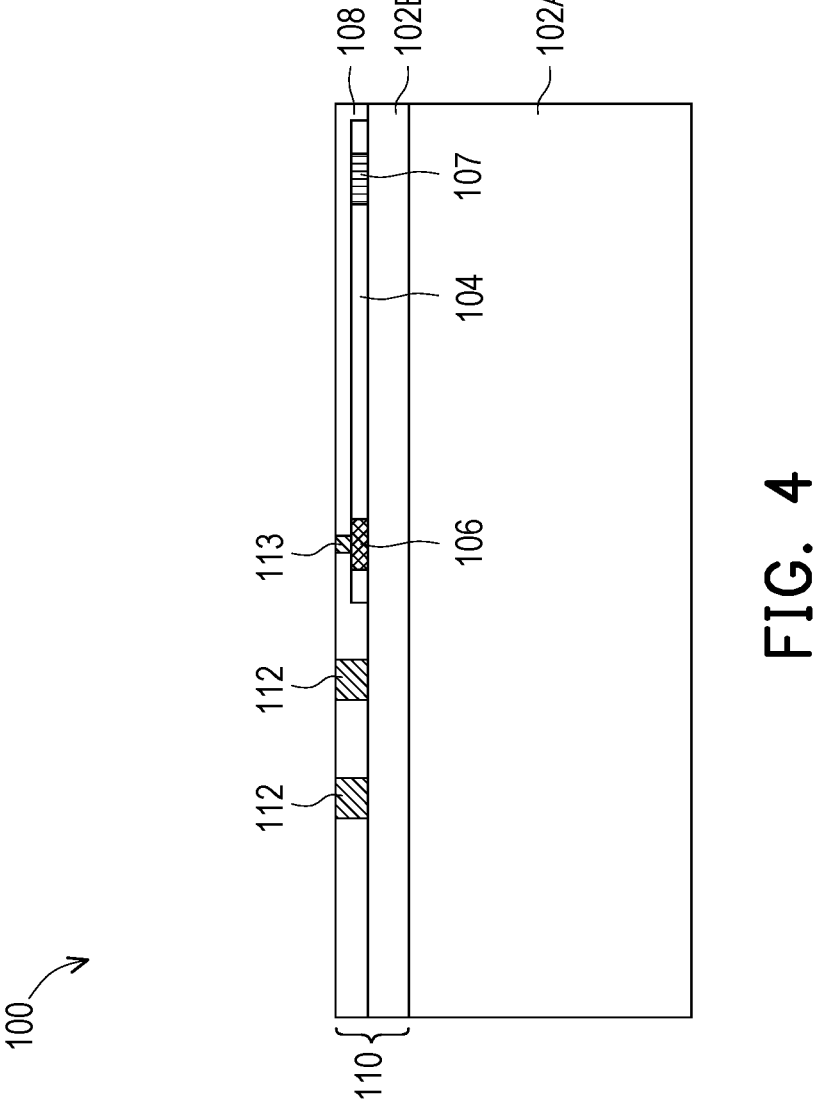

Conductive vias 112 and contacts 113 are then formed in the dielectric layer 108. The conductive vias 112 are formed beside the photonic layer and the contacts 113 are formed over photonic layer, as shown in FIG. 4. In some embodiments, the conductive vias 112 and the contacts 113 are formed by a damascene process (e.g., single damascene, dual damascene), or the like. For example, openings extending through the dielectric layer 108 are first formed using acceptable photolithography and etching techniques, and the openings are then filled with a conductive material using a suitable deposition process such as ALD and/or a plating process, thereby forming the conductive vias 112 and the contacts 113. In some embodiments, the conductive material includes a metal such as copper, silver, gold, tungsten, cobalt, aluminum, or alloys thereof. A planarization process (e.g., a CMP process or a grinding process) may be performed after the deposition process to remove excess conductive material along the top surface of the dielectric layer 108, such that top surfaces of the conductive vias 112, the contacts 113, and the dielectric layer 108 are levelled.

Although the formation of the conductive vias 112 and the contacts 113 is described as being formed simultaneously, it should be understood that the contacts 113 can be formed before or after the formation of the conductive vias 112. In some embodiments, the contacts 113 are electrically connected to the photonic components 106, enabling the transmission of electrical power or electrical signals to and from the photonic components 106.

Figure 5:
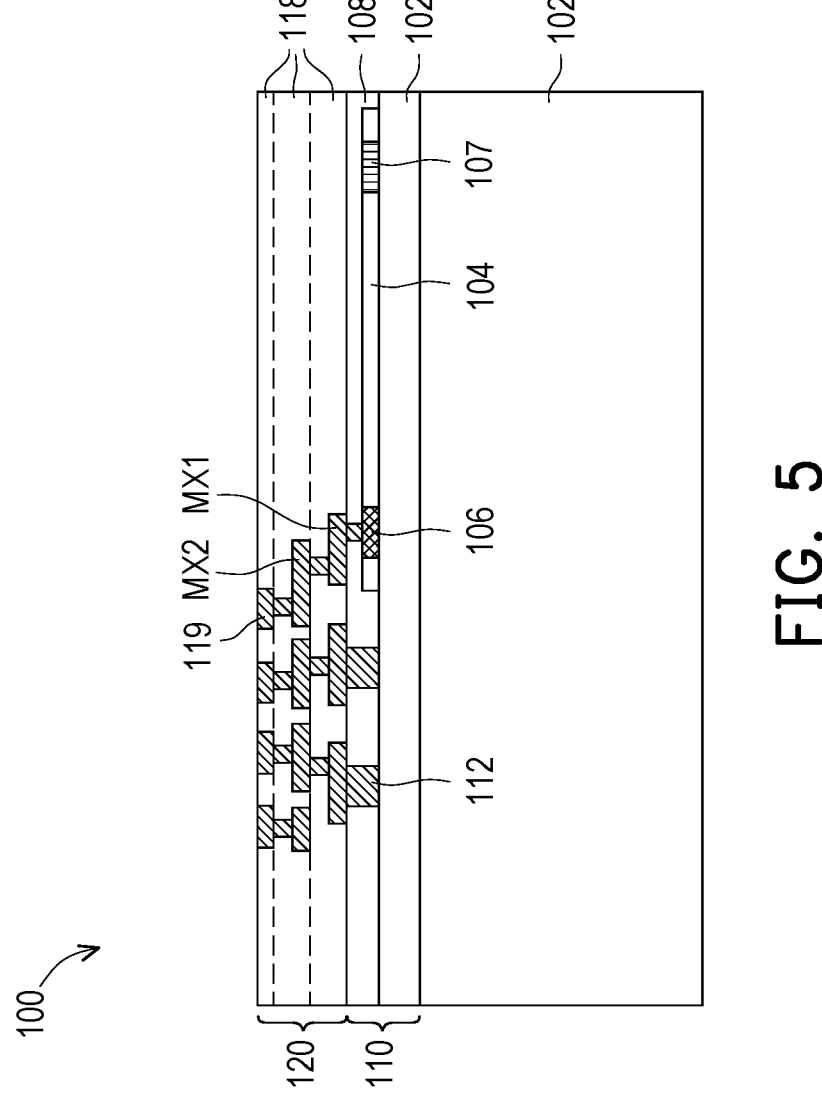

Turning to FIG. 5, a redistribution structure 120 is formed over the dielectric layer 108. In some embodiments, the redistribution structure 120 includes dielectric layers 118 and conductive patterns MX1, MX2 formed in the dielectric layers 118. The conductive patterns MX1, MX2 may be used to provide interconnection and electrical routing. For example, the redistribution structure 120 electrically connects the conductive vias 112, the contacts 113 to overlying devices such as electronic dies 130 (see FIG. 8). The dielectric layers 118 may be formed of one or more insulating materials such as silicon oxide or silicon nitride, and may be formed using a technique similar to those described above for forming the dielectric layer 108. The conductive patterns MX1. MX2 may include metal lines and vias, and may be formed by a damascene process or the like. In some embodiments, the conductive patterns MX2 is formed over the conductive patterns MX1 and after the conductive patterns MX1 is formed. Although the redistribution structure 120 is shown with two conductive patterns MX1. MX2, it should be understood that the redistribution structure 120 may be formed with more conductive patterns, for example, conductive patterns MX1, MX2, . . . , MXn. In addition, conductive pads 119 are formed in the topmost layer of the dielectric layers 118 and over the topmost conductive patterns (for example, the conductive patterns MX2 in FIG. 5). As shown in FIG. 5, top surfaces of the conductive pads 119 and the topmost dielectric layer 118 is substantially coplanar.

Figure 6:
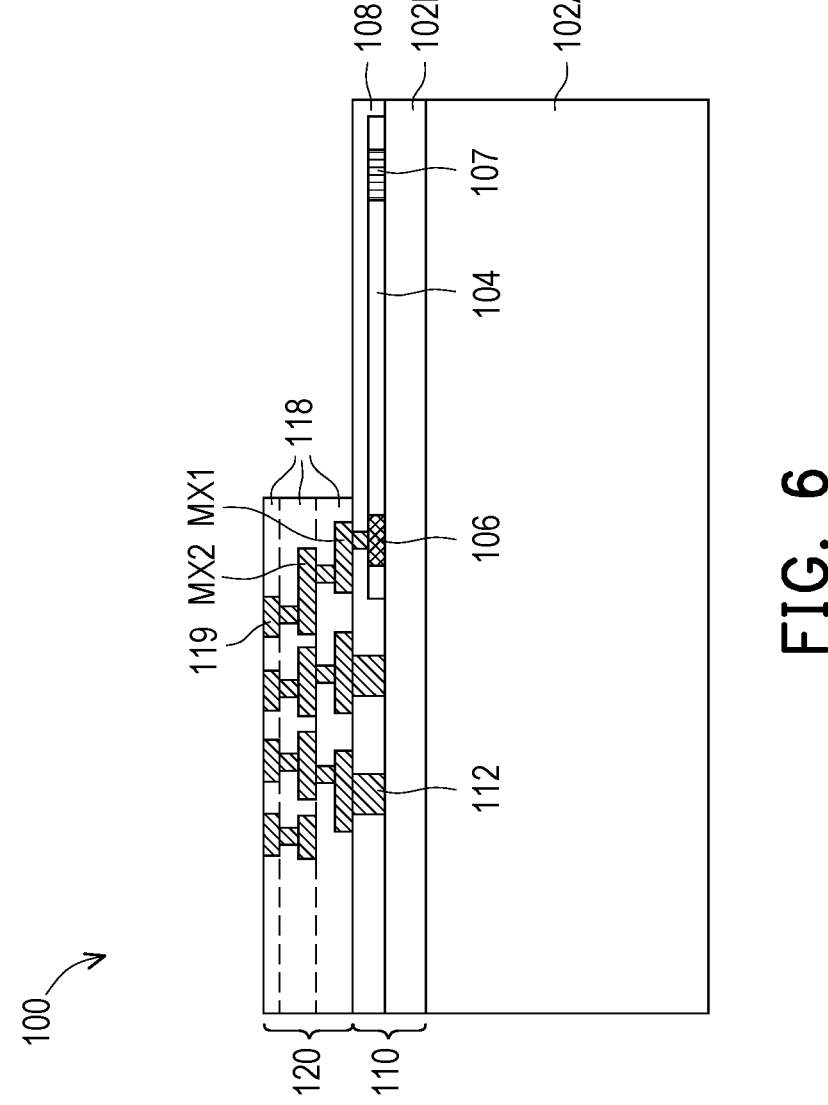
Figure 7:
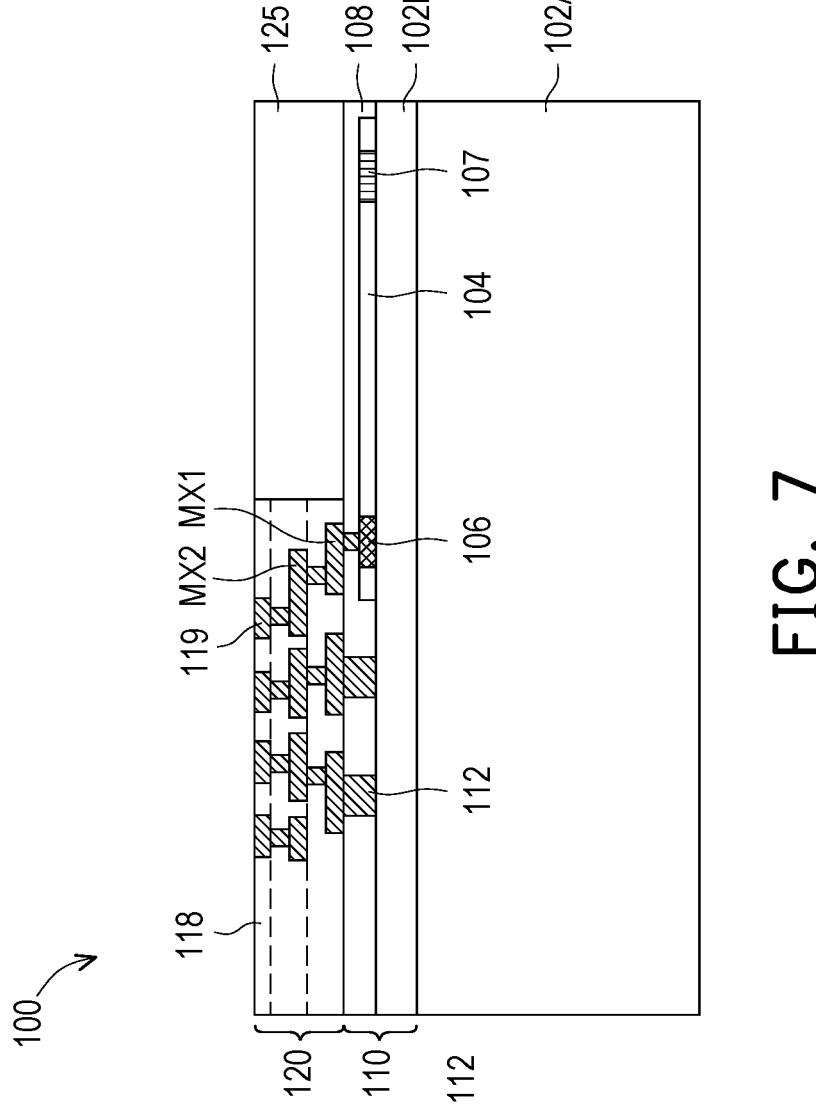

Referring to FIG. 6 and FIG. 7 together, the redistribution structure 120 is partially removed and replaced by a dielectric layer 125. In some embodiments, the removed portion of the redistribution structure 120 is above or approximately above a grating coupler 107. The portion of the redistribution structure 120 may be removed using suitable photolithography and etching techniques, such as by forming and patterning a photoresist and then performing an etching process to remove the dielectric layers 118 using the patterned photoresist as an etching mask. A portion of the dielectric layer 108 is exposed after the removal of the portion of the redistribution structure 120.

Thereafter, the dielectric layer 125 is deposited to replace the removed portion of the redistribution structure 120. The dielectric layer 125 may include one or more materials similar to those described above for the dielectric layer 108, and may be formed using a technique similar to those described above for the dielectric layer 108. In some embodiments, the dielectric layer 125 and the dielectric layer 108 are transparent or nearly transparent to light within the same range of wavelengths. Generally, the purpose of replacing the redistribution structure 120 with the dielectric layer 125 is to provide more efficient optical coupling between the grating coupler 107 and the optical component (not explicitly shown), so the material of the dielectric layer 125 may be selected to be more transparent, less lossy, or less reflective than those of the dielectric layers 118. Alternatively, the material of the dielectric layer 125 may be similar to those of the dielectric layers 118, but is deposited to be of better quality (e.g., less impurities, dislocations, etc.). The replacement of the redistribution structure 120 may reduce optical signal loss, thus allowing the package structure 100 to operate more efficiently.

In some other embodiments, the redistribution structure 120 is not etched and the dielectric layer 125 is not formed. In these embodiments, regions of the redistribution structure 120 may be substantially free of the conductive patterns MX1, MX2 and/or conductive pads 119 in order to allow transmission of optical power or optical signals through the dielectric layers 118.

Figure 8:
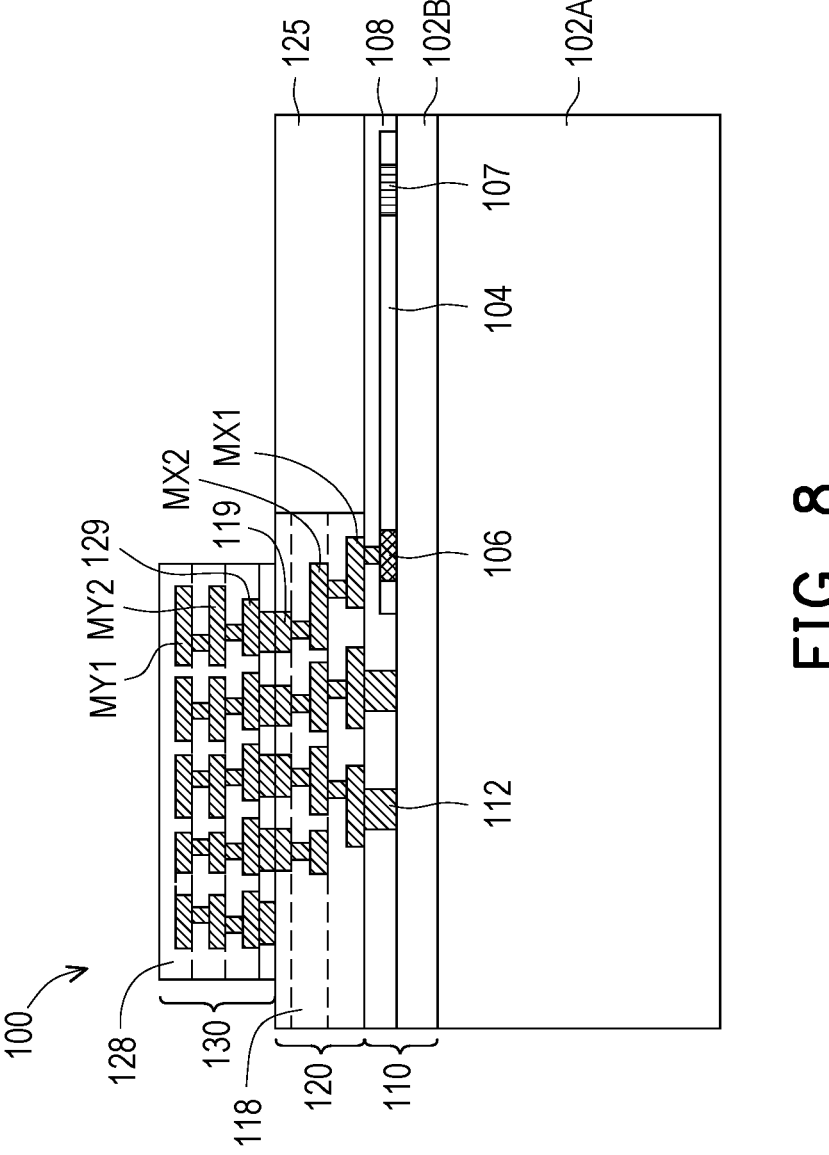

Referring to FIG. 8, one or more electronic dies 130 are bonded to the redistribution structure 120. The electronic die 130 (e.g., semiconductor devices, dies, or chips) may communicate with the photonic components 106 through electrical signals and not receive, transmit, or process optical signals. On the contrary, a photonic die (e.g., photonic die 150 in FIG. 16) may be able to receive, transmit, or process both of optical signals and electrical signals. For illustration purpose, only one electronic die 130 is shown in FIG. 8; however, there may be more than one electronic die 130 bonded to the redistribution structure 120.

The electronic die 130 may include integrated circuits for interfacing with the photonic components 106, such as circuits for controlling the operation of the photonic components 106. For example, the electronic die 130 includes controllers, drivers, transimpedance amplifiers, the like, or combinations thereof. The electronic die 130 may also include a CPU. In some embodiments, the electronic die 130 includes circuits for processing electrical signals received from photonic components 106, such as for processing electrical signals received from a photonic component 106 comprising a photodetector. In some embodiments, the electronic die 130 is an electronic integrated circuit (EIC) or the like that provides Serializer/Deserializer (SerDes) functionality, such that the electronic die 130 act as part of an I/O interface between optical signals and electrical signals within the package structure 100.

In addition, the electronic die 130 includes die connectors 129, which may be conductive pads or conductive pillars, and a redistribution structure connected to the die connectors 129. The redistribution structure of the electronic die 130 may be similar to the redistribution structure 120 described above and may include dielectric layers 128 and conductive patterns MY1, MY2 in the dielectric layers 128. Similarly, the topmost conductive patterns (for example, the conductive patterns MY2 in FIG. 8) connect to and are in contact with the die connectors 129. In some embodiments, the electronic die 130 also includes front-end devices (e.g., transistors) formed at a side opposite to the die connectors 129, and those devices are electrically connected to the die connectors 129 through the redistribution structure. Electronic dies 130 of various technology nodes such as N65, N40, N20, N16, . . . , N2 may be used and bonded to the redistribution structure 120 through hybrid bonding (e.g., dielectric-to-dielectric bonding and metal-to-metal bonding). During the hybrid bonding, metal bonding may occur between the die connectors 129 of the electronic die 130 and the conductive pads 119 of the redistribution structure 120.

Figure 9:
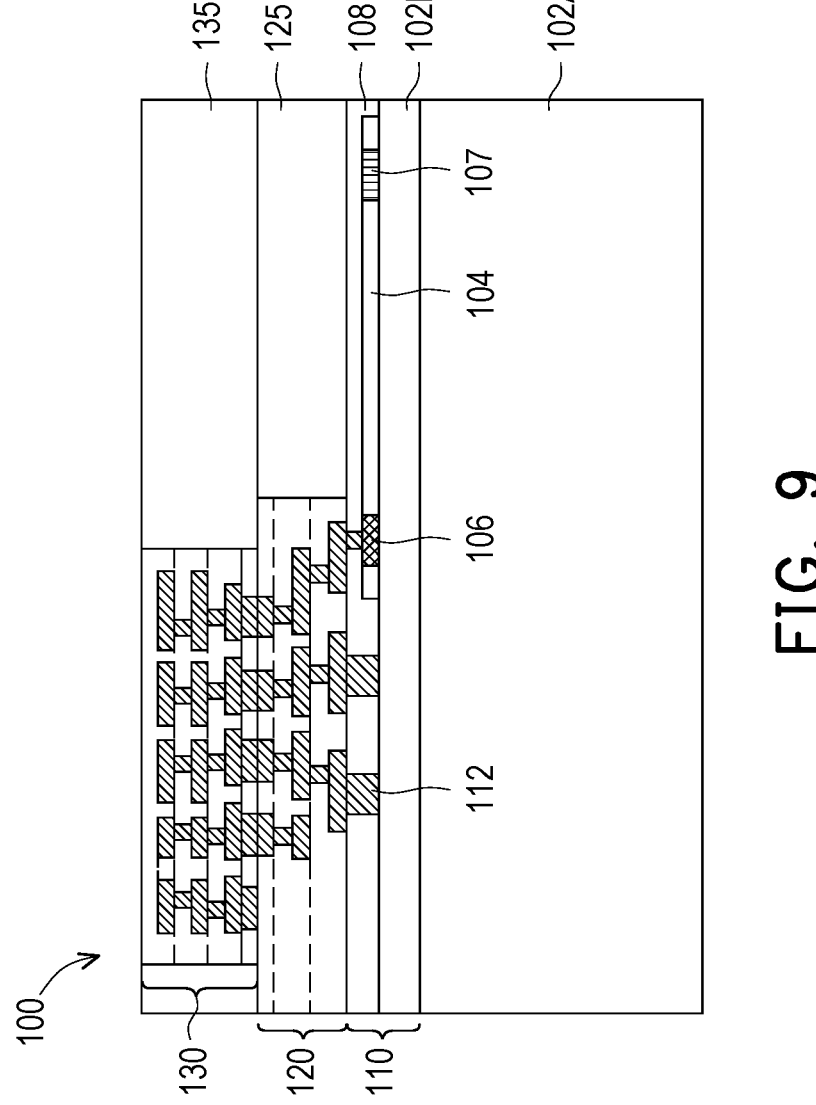

Referring to FIG. 9, a dielectric layer 135 is formed to laterally surround the electronic dies 130. For example, a gap-fill material is first deposited over the electronic dies 130, the redistribution structure 120, and the dielectric layer 125 through CVD, PVD, ALD, spin-on-dielectric process, the like, or a combination thereof. The gap-fill material may include dielectric material such as silicon oxide, silicon nitride, a polymer, the like, or a combination thereof. In some embodiments, the gap-fill material is a material (e.g., silicon oxide) that is substantially transparent to light at wavelengths suitable for transmitting optical signals or optical power between the grating coupler 107 and the optical component. A planarization process such as a CMP process, a grinding process is then performed to remove excess gap-fill material and further expose the electronic dies 130. In some embodiments, exposed surfaces of the electronic dies 130 and planarized surface of the dielectric layer 135 are substantially coplanar after the planarization process.

Using a suitable transparent material for the dielectric layer 135 may allow transmission of optical signals through the dielectric layer 135. Moreover, utilizing a pad-to-pad hybrid bonding to bond the electronic die 130 to the redistribution structure 120 can not only reduce a thickness of the resulting package structure 100, but also enhance the optical coupling between the grating coupler 107 and the optical component. This can reduce the size or processing cost of a photonic package, and the optical coupling to external components can be improved.

Figure 10:
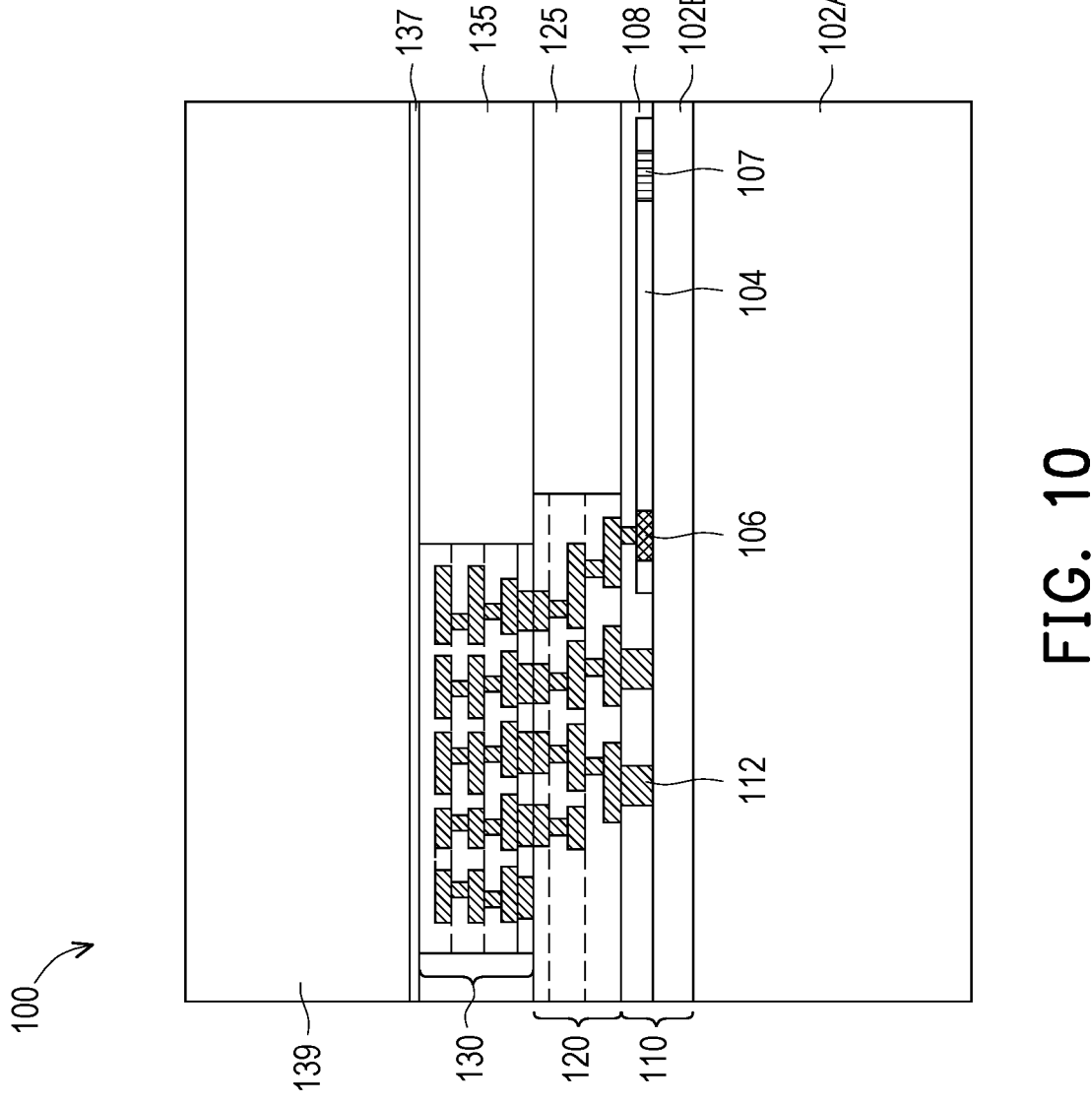
Figure 11:
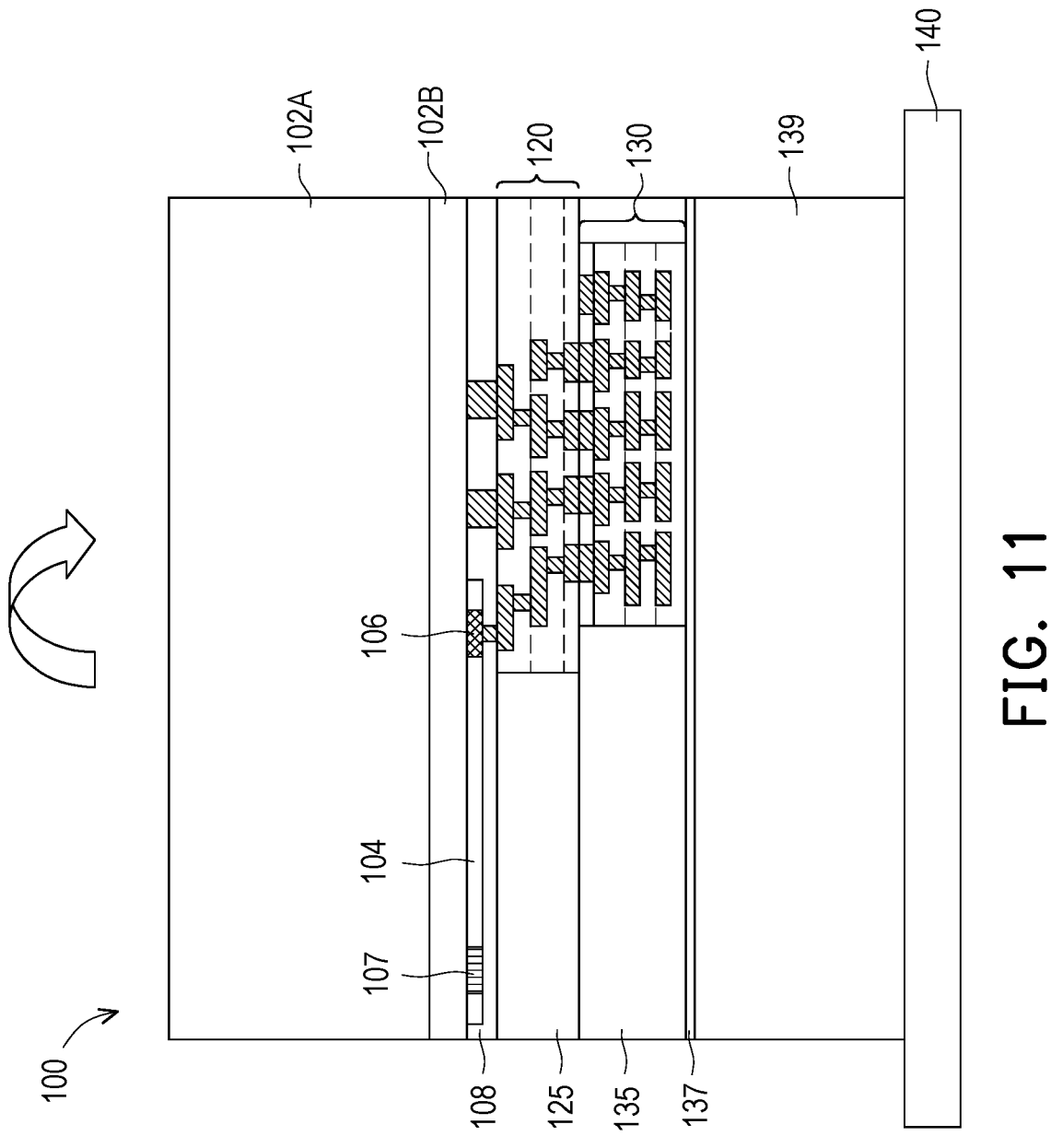

Turning to FIG. 10, a support 139 is attached to the structure in FIG. 9. The support 139 is a rigid structure which provides structural or mechanical stability. In some embodiments, the support 139 includes one or more materials such as silicon (e.g., a silicon wafer, bulk silicon, or the like), silicon oxide, metal, organic core material, the like, or another type of material. The support 139 may be attached to the structure (e.g., to the dielectric layer 135 and the electronic dies 130) using an adhesive layer 137. The support 139 may have a thickness between about 200 μm and about 1000 μm and lateral dimensions (e.g., length, width, and/or area) that are greater than, substantially the same as, or smaller than those of the structure in FIG. 9. Thereafter, the structure in FIG. 10 is flipped over and attached to a carrier 140, as shown in FIG. 11. The carrier 140 may be, for example, a wafer (e.g., a silicon wafer), a panel, a glass substrate, a ceramic substrate, or the like. The structure may be attached to the carrier 140 using, for example, an adhesive or a release layer (not shown).

Figure 12:
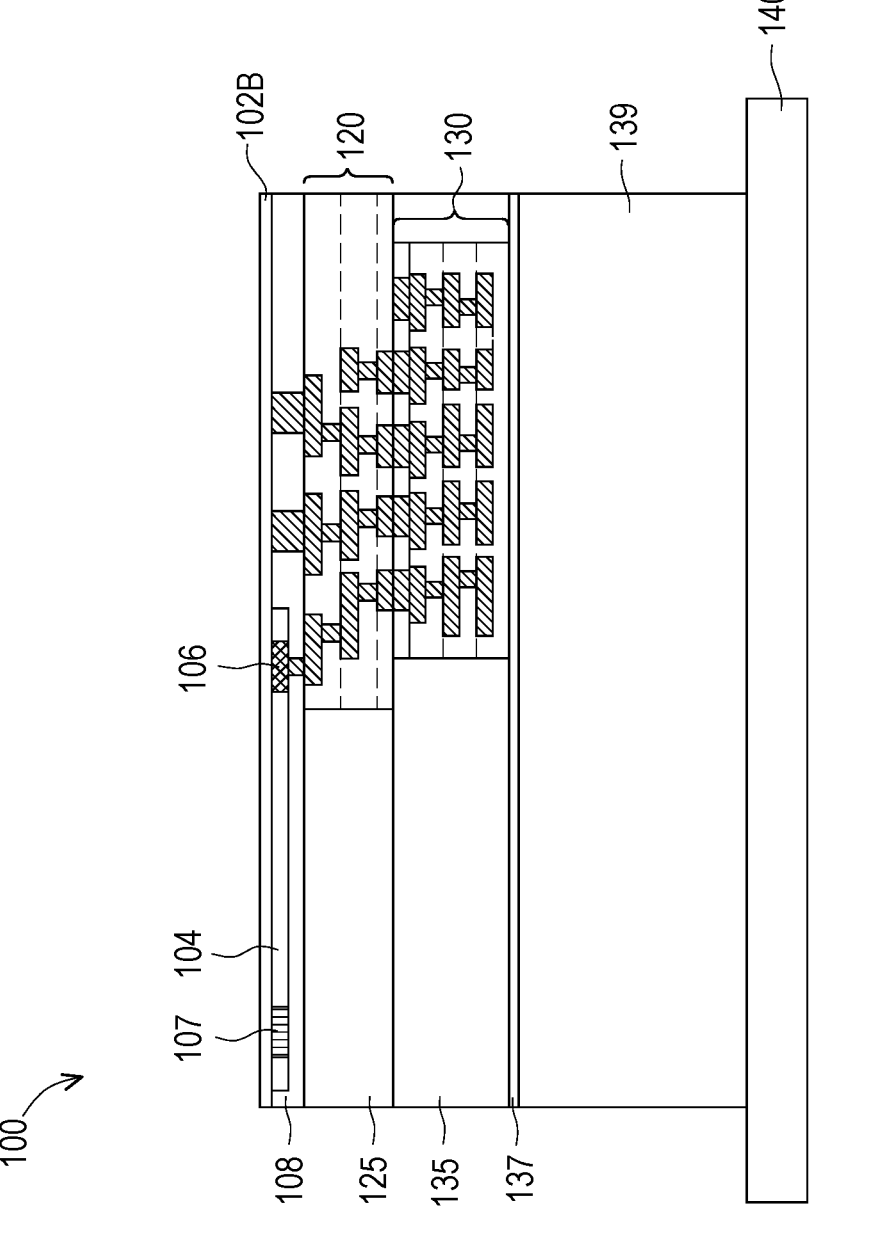

Referring to FIG. 12, the substrate 102A is removed. The substrate 102A may be removed using a planarization process (e.g., a CMP or grinding process), an etching process, a combination thereof, or the like. In some further embodiments, the dielectric layer 102B is also thinned during the removal process for the substrate 102A, or the dielectric layer 102B is thinned separately. Thinning the dielectric layer 102B may improve optical coupling between a waveguide 104 and other waveguides 144 (see FIG. 16).

Figure 13:
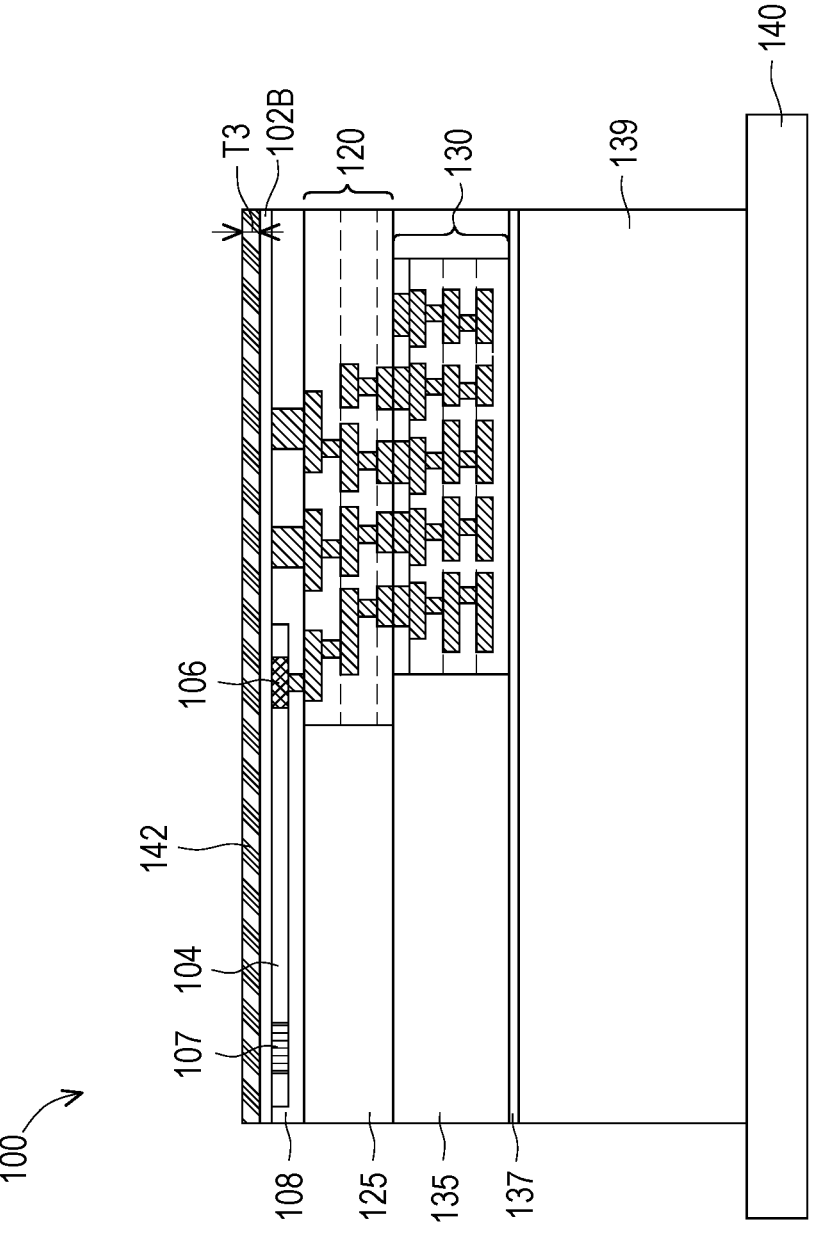

Referring to FIG. 13 and FIG. 14 together, nitride waveguides 144A are formed over the dielectric layer 102B. A silicon nitride layer 142 is first deposited on the dielectric layer 102B using a suitable deposition technique, such as CVD, PECVD, LPCVD, PVD, or the like. In some embodiments, the silicon nitride layer 142 is formed to have a thickness T3 in the range of about 100 nm to about 2000 nm. For example, the thickness T3 may be greater than 300 nm.

The silicon nitride layer 142 is then patterned to form the nitride waveguides 144A. For ease of description, the nitride waveguides 144A and the subsequently formed nitride waveguides 144B, 144C, and 144D (see FIG. 16) are collectively referred to as nitride waveguides 144. The nitride waveguides 144A may be patterned using acceptable photolithography and etching techniques. For example, a hard mask layer is formed over the silicon nitride layer 142 and then patterned. The pattern of the hard mask layer may be transferred to the silicon nitride layer 142 using an etching process such as a dry etching process, a wet etching process. In some embodiments, more than one photolithography and etching sequence may be used. In some further embodiments, etching depths of the silicon nitride layer 142 range from about 0 nm to about 2000 nm. In certain cases, the etching depths of the silicon nitride layer 142 may be greater than 150 nm. Similarly, a single nitride waveguide 144 or multiple nitride waveguides 144 may be patterned from the silicon nitride layer 142. In embodiments where multiple nitride waveguides 144 are formed, the nitride waveguides 144 can be discrete waveguides 144 or a single continuous structure of connected nitride waveguides 144. In some further embodiments, one or more of the waveguides 104 form a continuous loop. For example, the continuous loop of the waveguides 104 may have a meandering shape, and the feature details of which will be described later with reference to FIG. 21.

In some further embodiments, nitride waveguides 144 may include photonic structures such as grating couplers, edge couplers, or couplers (e.g., mode converters) for transmission of optical signals between two nitride waveguides 144 and/or between a nitride waveguide 144 and a waveguide 104. Waveguides formed from silicon nitride (e.g., nitride waveguides 144) may have advantages over silicon waveguides (e.g., waveguides 104). For example, silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness). Thus, the embodiments described herein can enable the formation of a photonic package that includes both nitride waveguides (e.g., nitride waveguides 144) and silicon waveguides (e.g., waveguides 104).

Figure 15:
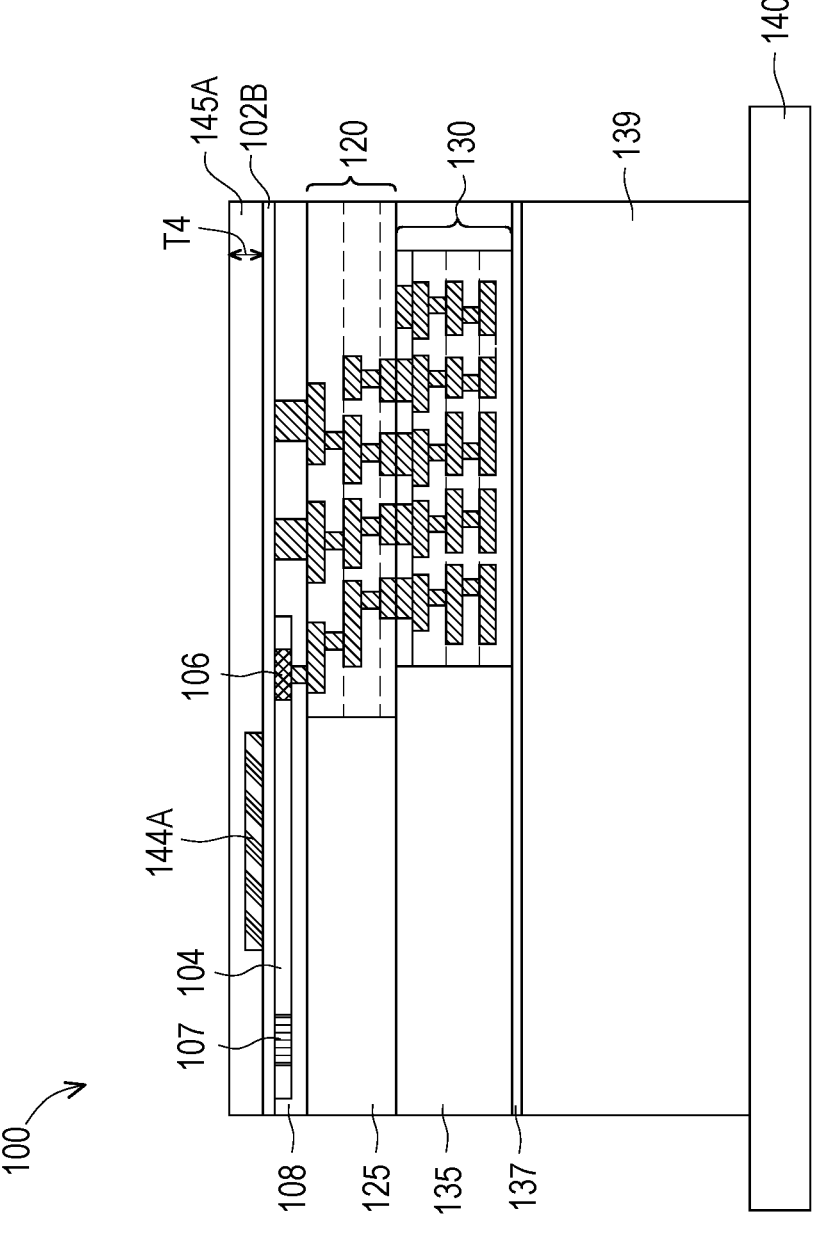

Referring to FIG. 15, a dielectric layer 145A is formed over the nitride waveguides 144A and the dielectric layer 102B. The dielectric layer 145A may include one or more materials similar to those described above for the dielectric layer 108 or the dielectric layer 125, and may be formed using a similar technique. For example, the dielectric layer 145A includes a silicon oxide, spin-on glass, or the like, which is formed by CVD, PVD, or a spin-on process. In some embodiments, a planarization process (e.g., a CMP or grinding process) is subsequently performed to remove excess material of the dielectric layer 145A. After the planarization process, the dielectric layer 145A may have a thickness T4 in a range of between about 0 μm and about 10 μm, for example.

Figure 16:
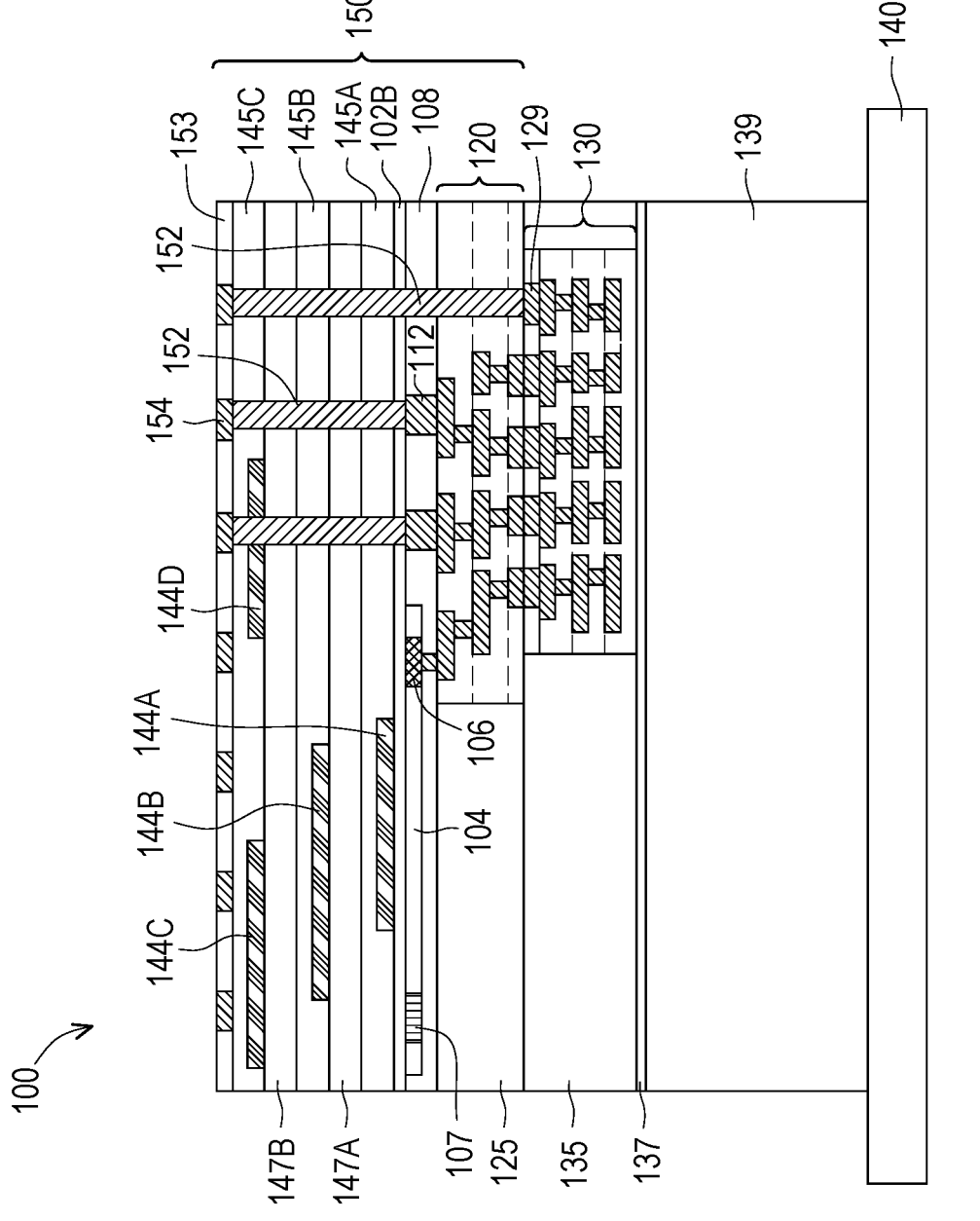

Referring next to FIG. 16, a dielectric layer 147A is formed on the dielectric layer 145A, a nitride waveguide 144B is then formed on the dielectric layer 147A and covered by another dielectric layer 145B. For example, the dielectric layer 145B is formed over the nitride waveguide 144B and over the dielectric layer 145A. The dielectric layers 147A/145B and the nitride waveguide 144B may be formed of a same or similar material using a same or similar method as the dielectric layer 145A and the nitride wave- guide 144A, respectively, and thus details are not repeated herein. The processing mentioned above can be repeated to form additional dielectric layers (e.g., dielectric layers 145C, 147B) and additional nitride waveguides (e.g., nitride wave- guides 144C, 144D). Any number of the nitride waveguides and the dielectric layers can be used depending on the design requirements. As shown in FIG. 16, the waveguides (e.g., 104, 144A, 144B, and 144C) in adjacent (e.g., immediately adjacent) dielectric layers may laterally overlap one another.

After forming a desired number of layers of nitride waveguides and dielectric layers, conductive vias 152 are formed to extend through the dielectric layers (e.g., 102B, 145A, 147A, 145B, 147B, and 145C) and connect the with conductive vias 112. As shown in FIG. 16, some conductive vias 152 may further extend through the dielectric layers 108 and the redistribution structure 120 to connect with the die connectors 129 of the electronic die 130. In some embodi- ments, the conductive vias 152 are referred to as Through Dielectric Vias (TDVs). In addition, a dielectric layer 153 is formed on the topmost dielectric layer (e.g., the dielectric layer 145C), and conductive pads 154 are formed through the dielectric layer 153 and over respective conductive vias 152. The conductive vias 152 and the conductive pads 154 may be formed by the same or similar methods as the conductive vias 112 and the conductive pads 119, respec- tively, and thus details are not repeated herein. Although one package structure 100 is shown in FIG. 16, It should be understood that tens, hundreds, or more identical package structures may be formed over the carrier 140. In such embodiments, a singulation process is performed to separate the multiple package structures into individual package structures 100.

Figure 17:
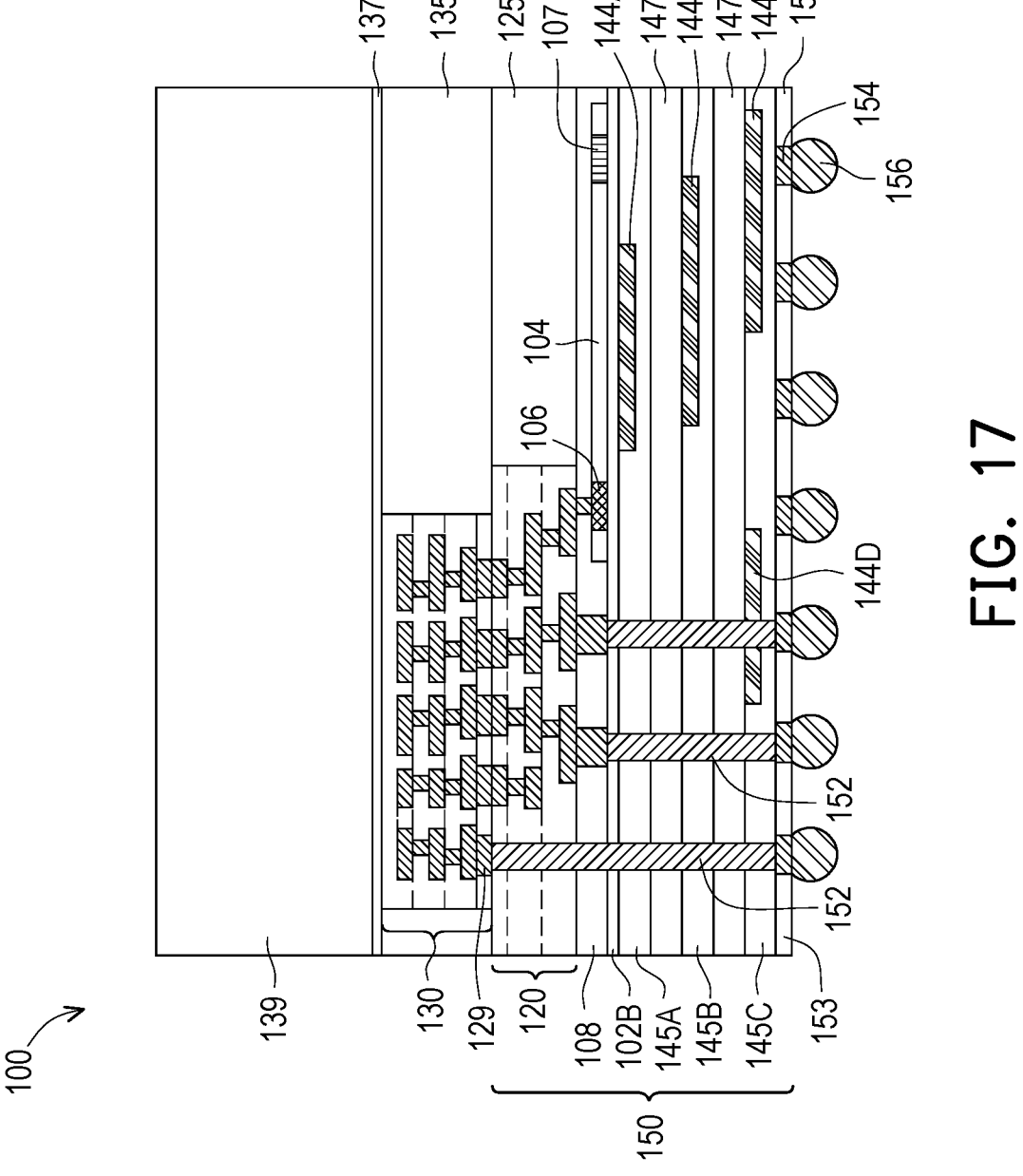

Referring to FIG. 17, the carrier 140 is removed and the package structure 100 is obtained. In some embodiments, the structure below the electronic die 130 and the dielectric layer 135 is referred to as a photonic die 150, which includes the redistribution structure 120, the dielectric layers 125, 108, 102B, 145A-145C, 147A-147B, and 153 and compo- nents formed in the dielectric layers, such as the waveguide 104, the photonic component 106, the grating coupler 107, the nitride waveguides 144 (e.g., 144A, 144B, 144C, and 144D), the conductive vias 112, 152 and conductive pads 154. That is, the package structure 100 includes an electronic die 130 bonded to a photonic die 150, and optionally, may include support 139. In other words, the package structure 100 includes a die stack of the electrical die 130 and the photonic die 150. The package structure 100 may also be referred to as the photonic package. Furthermore, in some embodiments, conductive bumps 156 are disposed on and electrically connected to the conductive pads 154 of the photonic die 150 for bonding the package structure 100 to other components.

Figure 18:
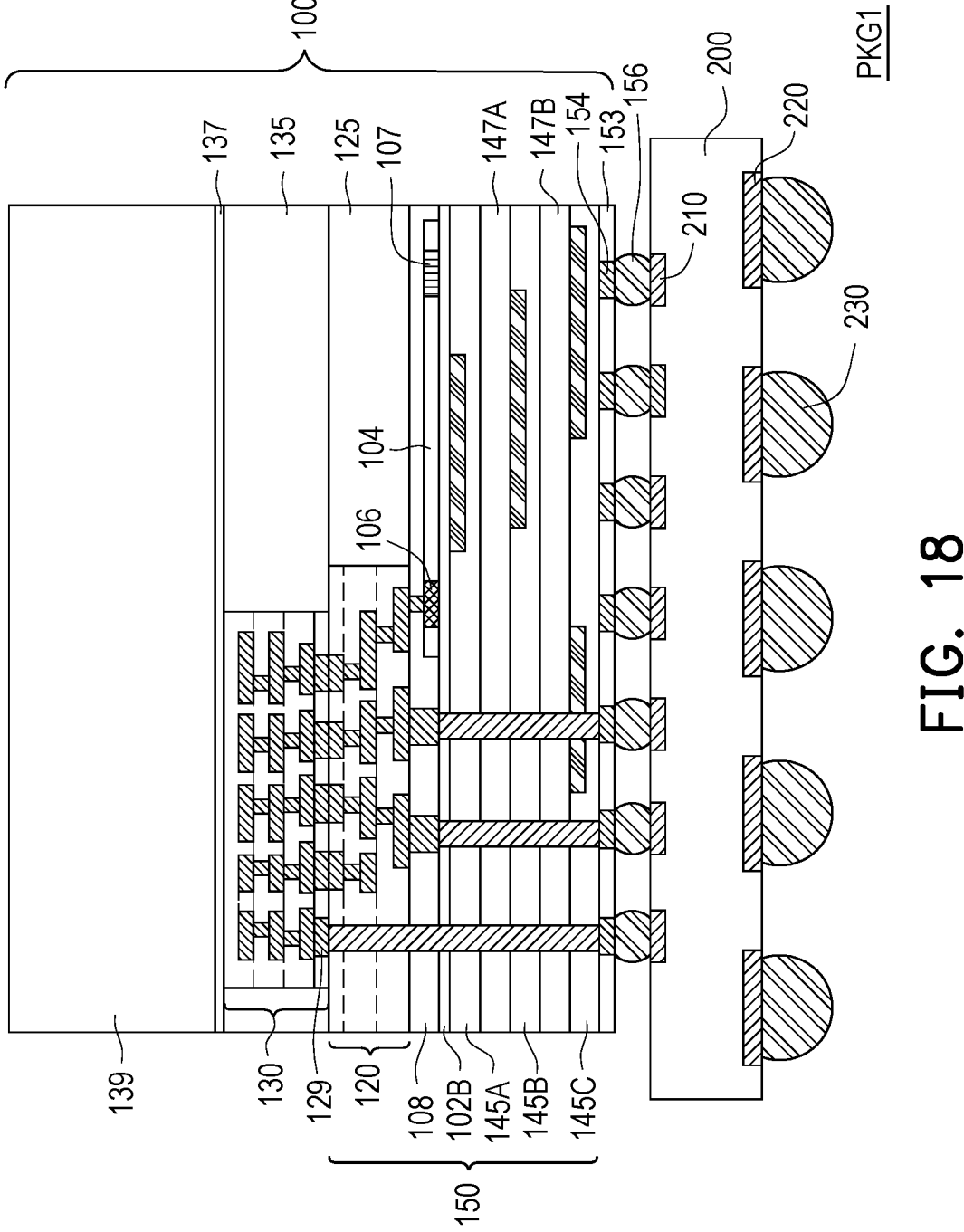
FIG. 18 is a schematic sectional view of a semiconductor package in accordance with some embodiments of the present disclosure.

FIG. 18 is a schematic sectional view of a semiconductor package PKG1 in accordance with some embodiments of the present disclosure. As shown in FIG. 18, the package structure 100 illustrated in FIG. 17 is further disposed on a circuit substrate 200 to obtain a package structure PKG1. The circuit substrate 200 may be an organic flexible sub- strate or a printed circuit board. For example, the circuit substrate 200 includes conductive pads 210, 220 respec- tively on opposite sides of the circuit substrate 200, and redistribution layers and vias (not explicitly shown) between the conductive pads 210 and 220 to electrically connected the conductive pads 210 and 220. In some embodiments, the conductive pads 210 and 220 are metal pads or metal alloy pads. In addition, the redistribution layers and vias together may provide routing function for the circuit substrate 200.

In some embodiments, the package structure 100 is bonded to the circuit substrate 200 through the conductive bumps, 156 such that the package structure 100 is electri- cally connected to the circuit substrate 200 through the conductive bumps 156. In some other embodiments, con- ductive terminals 230 are formed over the circuit substrate 200 (for example, on the conductive pads 220). The con- ductive terminals 230 may be solder balls or ball grid array (BGA) balls.

Figure 19:
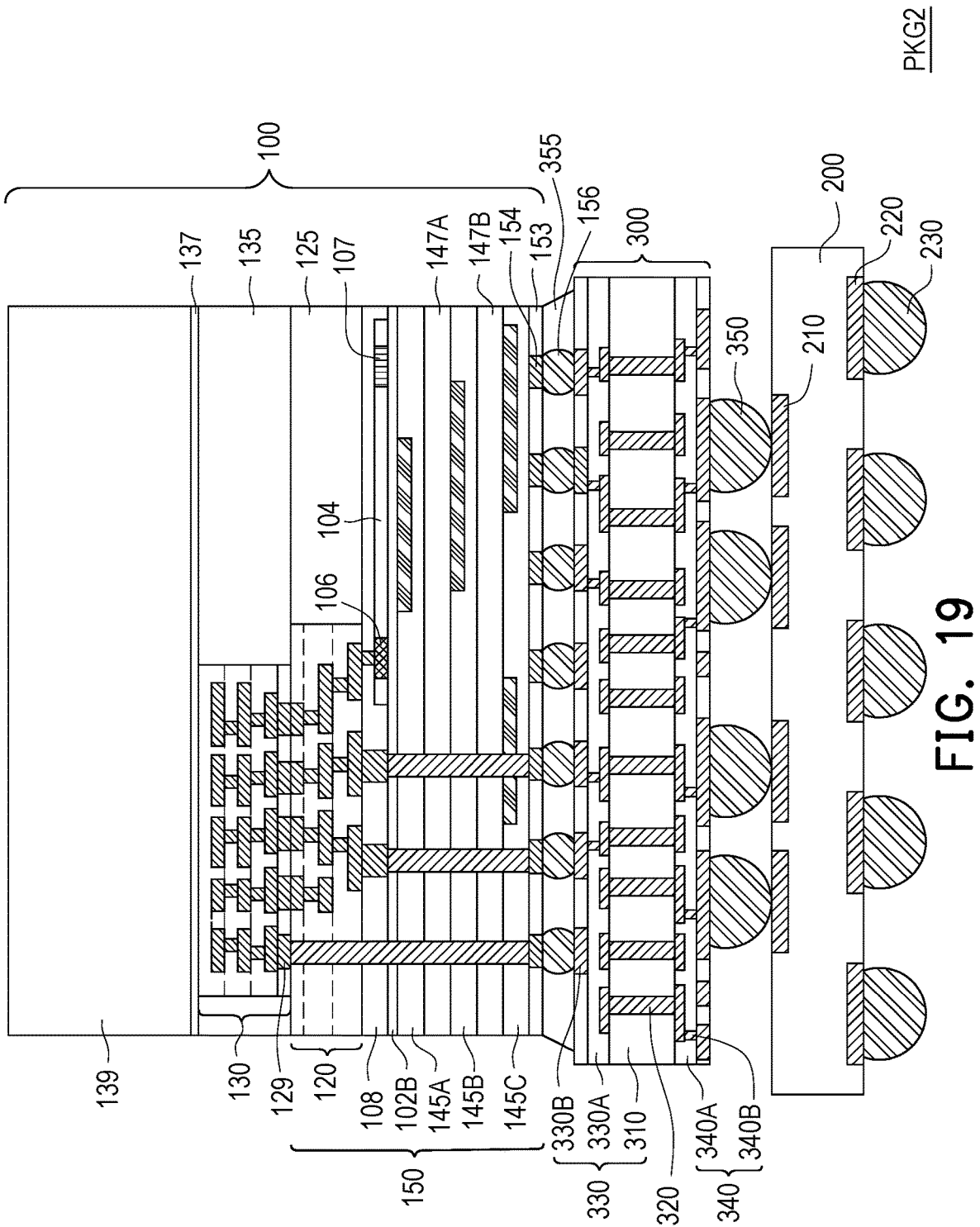
FIG. 19 is a schematic sectional view of a semiconductor package in accordance with some embodiments of the present disclosure.

FIG. 19 is a schematic sectional view of a semiconductor package PKG2 in accordance with some embodiments of the present disclosure. The semiconductor package PKG2 may be similar to the semiconductor package PKG1 illustrated in FIG. 18, thus the same reference numerals are used to refer to the same or liked parts, and its detailed description is not repeated herein. The difference between the embodiments is that an interposer 300 is further provided in the semicon- ductor package PKG2.

The package structure 100 illustrated in FIG. 17 is mounted onto an interposer 300 over the circuit substrate 200, for example. In other words, the interposer 300 is disposed between the circuit substrate 200 and the package structure 100. In some embodiments, the package structure 100 is electrically connected to the circuit substrate 200 through the interposer 300. The interposer 300 includes a core substrate 310, through vias 320 penetrating through the core substrate 310, and redistribution structures 330, 340 respectively disposed on opposite sides of the core substrate 310, as shown in FIG. 19. In some embodiments, the core substrate 310 is a bulk silicon substrate, which may be doped or undoped; or a silicon-on-insulator (SOI) substrate. In such embodiments, the through vias 320 are referred to as Through Silicon Vias (TSVs). Through vias 320 may be used to electrically connect the redistribution structures 330 and 340.

The redistribution structures 330 and 340 respectively include one or more dielectric layers 330A and 340A and one or more redistribution layers 330B and 340B, for example. Each of the redistribution layers 330B and 340B may be formed in respective dielectric layers 330A and 340A, respectively. In addition, top surfaces of a topmost layer of the redistribution layers 330B may be exposed to and in physical contact with the conductive bumps 156, and a plurality of conductive terminals 350 is disposed on exposed surfaces of a bottommost layer of the redistribution layers 340B.

The materials of the dielectric layers 330A and 340A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a com- bination thereof. In some embodiments, the dielectric layers 330A and 340A are formed by suitable deposition tech- niques such as spin-on coating, CVD, or the like, and are patterned using a photolithography and/or etching process. The dielectric layers 330A and 340A may include substan- tially the same or different materials. The material of the redistribution layers 330B and 340B may be metallic mate- rial such as aluminum, titanium, copper, nickel, tungsten, and/or alloys thereof. In some embodiments, the redistribu- tion layers 330B and 340B are formed by electroplating or deposition, which may be further patterned using a photolithography and etching process. The redistribution layers 330B and 340B may also include substantially the same or different materials. It should be understood that any number of redistribution layers and dielectric layers may be used for the redistribution structures 330 and 340 depending on the design requirements.

In some embodiments, the package structure 100 is electrically connected to the redistribution structure 330 of the interposer 300 through the conductive bumps 156. An underfill structure 355 may be formed to cover and surround the conductive bumps 156. In other words, the underfill structure 355 fills into a space located between the package structure 100 and the interposer 300. Furthermore, the conductive terminals 350 formed on the bottommost layer of the redistribution layers 340B forms the electrical connection between the circuit substrate 200 and the interposer 300 and further to the package structure 100. In some embodiments, the conductive terminals 350 are chip connectors or BGA balls. In the semiconductor package PKG2, the package structure 100 is disposed on and electrically connected to the interposer 300 through the conductive bumps 156, while the interposer 300 is disposed on and electrically connected to the circuit substrate 200 through the conductive terminals 350. In such embodiments, the semiconductor package PKG2 can be referred to as a Chip on Wafer on Substrate (CoWoS) package.

Figure 20:
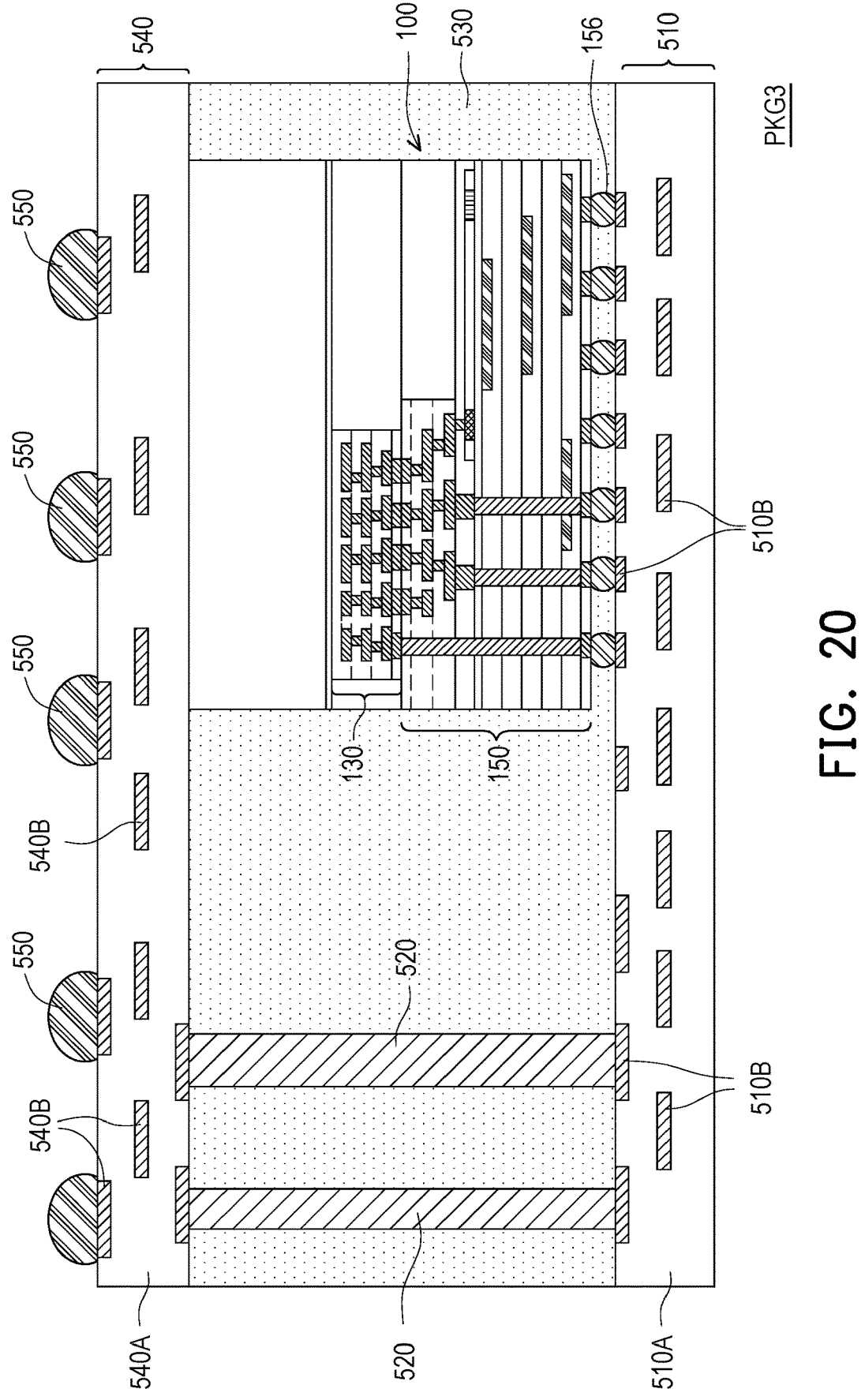
FIG. 20 is a schematic sectional view of a semiconductor package in accordance with some embodiments of the present disclosure.

FIG. 20 is a schematic sectional view of a semiconductor package PKG3 in accordance with some embodiments of the present disclosure. For example, the package structure 100 illustrated in FIG. 17 is bonded onto a first redistribution structure 510 by flip chip bonding, and the package structure 100 is electrically connected to the first redistribution structure 510 through the conductive bumps 156. In some embodiments, the first redistribution structure 510 is similar to the redistribution structures 330 and 340 depicted in FIG. 19 and includes one or more dielectric layers 510A and one or more redistribution layers 510B, where each redistribution layer 510B is formed in a respective dielectric layer 510A. A material of the dielectric layers 510A and a material of the redistribution layers 510B may be similar to or substantially the same as the materials of the dielectric layers 330A and the redistribution layers 330B described above, thus the details are not repeated herein.

Next, a plurality of through vias 520 is disposed on the first redistribution structure 510 and beside the package structure 100. In some embodiments, the through vias 520 are electrically connected to the redistribution layers 510B. The material of the through vias 520 may include a metal material such as copper or copper alloys, or the like. In some embodiments, an insulating encapsulant 530 is formed on the first redistribution structure 510 to encapsulate the package structure 100 and the through vias 520. The material of the insulating encapsulant 530 may include polymers (such as epoxy resins, phenolic resins, silicon-containing resins, or other suitable resins), dielectric materials having low permittivity (Dk) and low loss tangent (Df) properties, or other suitable materials. In some other embodiments, the insulating encapsulant 530 further includes inorganic filler or inorganic compound (e.g. silica, clay, and so on).

In some further embodiments, one or more semiconductor dies (not explicitly shown) are encapsulated in the insulating encapsulant 530 together with the package structure 100. The semiconductor dies may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. Furthermore, the through vias 520 extend through the insulating encapsulant 530 after the insulating encapsulant 530 is formed, thus the through vias 520 may also referred to as Through Insulating Vias (TIVs).

In some embodiments, a second redistribution structure 540 is disposed over the insulating encapsulant 530 and the package structure 100. The second redistribution structure 540 may be electrically connected to the through vias 520, and may be electrically connected to the package structure 100. In some embodiments, the redistribution structure 540 is similar to the first redistribution structure 510 and includes one or more dielectric layers 540A and one or more redistribution layers 540B. A material of the dielectric layers 540A and a material of the redistribution layers 540B are similar to those of the dielectric layers 330A and the redistribution layers 330B described above, for example. Therefore, the details are not repeated herein.

In some embodiments, a plurality of conductive terminals 550 is disposed over the second redistribution structure 540. For example, the conductive terminals 550, which may be solder balls or BGA balls, are disposed on the topmost layer of redistribution layer 540B (or, conductive pads) through a ball placement process or reflow process. In some embodiments, the conductive terminals 550 are electrically connected to the photonic die 150 or the electronic die 130 of the package structure 100 through the first and/or second redistribution structures 510 and/or 540 and the through vias 520.

Figure 21:
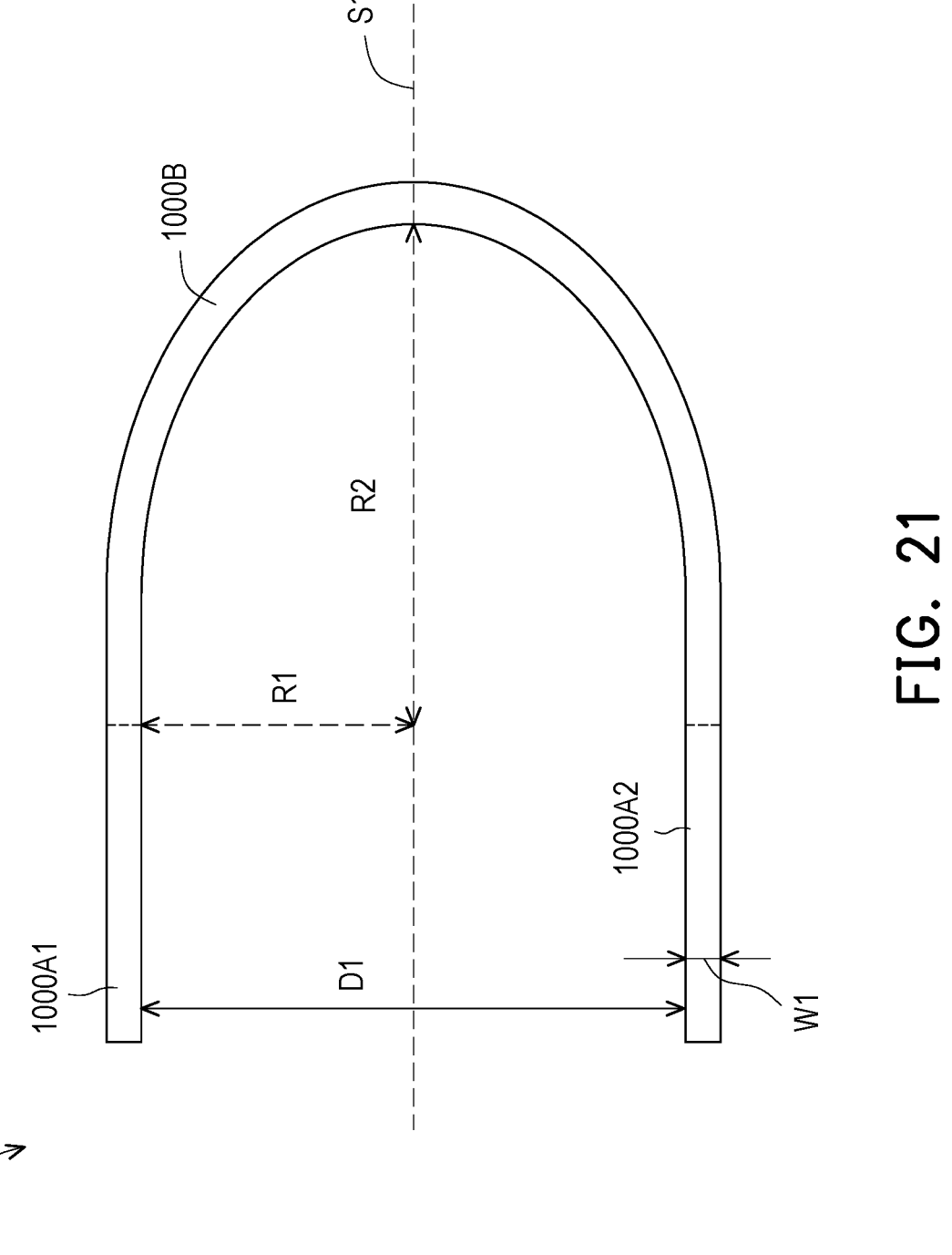
FIG. 21 is a schematic plan view of a portion of a waveguide in a package structure in accordance with some embodiments of the present disclosure.

FIG. 21 is a schematic top view of a portion of a waveguide 1000 in a package structure in accordance with some embodiments of the present disclosure. For example, the waveguide 1000 may be a silicon waveguide or a nitride (e.g., silicon nitride) waveguide described before with reference to FIG. 2 and FIGS. 14-16 (i.e., the waveguides 104 and/or 144). Referring to FIGS. 2, and 14-16 and further referring to FIG. 21, the waveguide 1000 (i.e., the waveguides 104 and/or 144) may has a meandering shape. The meandering portion of the waveguide 1000 may be formed with, for example, two straight segments (or, straight line segments) 1000A1 and 1000A2 and a bend segment 1000B connecting the straight segments 1000A1 and 1000A2. As shown in FIG. 21, the two straight segments 1000A1 and 1000A2 may be arranged parallel to each other at a distance D1. The parallel distance D1 may range from about 1 μm to about 1000 μm.

According to some embodiments of the present disclosure, the bend segment 1000B of the waveguide 1000 is designed to have a smooth, continuous curved shape that is free of sharp corners or bends. In other words, the bend segment 1000B may have a gradual curvature (i.e., a varying curvature). In certain embodiments, the bend segment 1000B is optimized by following Equation below:

$$x(s) = \int_0^s \cos\left(\frac{\alpha}{2} \cdot u^2\right) du$$

$$y(s) = \int_0^s \sin\left(\frac{\alpha}{2} \cdot u^2\right) du$$

where $\alpha$ is a linear curvature changing rate calculated using below Equation:

$$\alpha = \frac{\left[2\sqrt{2} \int_0^{\sqrt{\pi p/2}} \sin t^2 \, dt + \frac{2}{\sqrt{\pi p}} \sin\frac{\pi(1-p)}{2}\right]^2}{d^2}$$

in which d is the distance between two parallel straight segments (i.e., the parallel distance D1 described above), and p is a designated factor. For example, when a bend segment connecting two parallel straight segments is a semicircle arc, the factor p is equal to 0; and in an optimized embodiment of the present disclosure, the factor p is designated as 1.

According to above Equations, the optimized bend segment 1000B (may be referred to as an optimal bend segment) has a semi-elliptical arc shape, and x and y correspond to semi-major axis R2 and semi-minor axis R1 of the semi-elliptical arc, respectively. As shown in FIG. 21, the meandering portion of the waveguide 1000 may be symmetrical along an axis S1, wherein the axis S1 coincides with the semi-major axis R2 of the semi-elliptical arc and is perpendicular to the semi-minor axis R1 of the semi-elliptical arc. In one embodiment where the parallel distance D1 is about 60 μm, x (i.e., the semi-major axis R2) is about 50 μm and y (i.e., the semi-minor axis R1) is about 30 μm. It should be understood that d, x, and y can be various values as long as they follow the above equation. For example, the semi-minor axis R1 and the semi-major axis R2 may be in a range of about 0 μm to about 500 μm, respectively. In some further embodiments where the waveguide 1000 is a silicon waveguide, a width W1 of the straight segments 1000A1, 1000A2 and bend segment 1000B is in a range of about 100 nm and about 3000 nm. For example, the width W1 may be greater than 100 nm. Alternatively, the width W1 may be in a range of about 500 nm to about 3000 nm if the waveguide 1000 is a silicon nitride waveguide. In such cases, the width W1 may be greater than 500 nm.

Embodiments may achieve advantages. For example, the semiconductor package utilizes a pad-to-pad bonding to bond the electronic die and the photonic die, so that the bonding density is increased, and a shorter wire delay can be achieved. A near-zero interconnect capacitance in which the least amount of energy is consumed can be obtained by using through vias (e.g., TDVs, TIVs), to transmit electronical signals between the electronic die and photonic die.

Furthermore, the photonic package of the semiconductor package includes the use of optimized bend segment in a meandering portion of a silicon waveguide or silicon nitride waveguide. Through such optimization, the multi-mode effect generated in waveguides with sharp corners or bends can be minimized; and the smooth, continuous curve of the optimal bend segment can reduce the number of propagation modes, thereby reducing distortion and loss of the optical signal. In addition, the optimal bend segment can reduce the bending loss that generally occurs when light travels through a curved waveguide and maintain a high level of optical power throughout the waveguide. By ensuring the light travels in a single mode through the waveguide, crosstalk between multiple waveguides can be further reduced. Overall, the optimal bend segment can improve optical performance, reduce signal loss, and enable an integration of photonic circuits in a small space.

In accordance with an embodiment of the disclosure, a semiconductor package is described. The semiconductor package includes a photonic package that includes an electronic die and a photonic die bonded to each other. The photonic die includes a plurality of waveguides, each laterally surrounded by a respective dielectric layer, and a first redistribution structure disposed over the waveguides and the dielectric layers. At least one of the waveguides includes a meandering portion, the meandering portion includes two straight segments and a bend segment with a gradual curvature.

In accordance with another embodiment of the disclosure, a semiconductor package is described. The semiconductor package includes a circuit substrate and a photonic package disposed over the circuit substrate. The photonic package includes a die stack of an electronical die and a photonic die, wherein a waveguide in the photonic die includes a pair of parallel line portions and an optimal bend portion connecting the pair of parallel line portions, the optimal bend portion has a semi-minor axis and a semi-major axis, and a curvature of the optimal bend portion is gradually varied.

In accordance with yet another embodiment of the disclosure, a method for forming a semiconductor package is described. The method at least includes the following steps. An electronical die and a photonic die are formed. The electronical die is bonded to the photonic die through a pad-to-pad hybrid bonding process to form a photonic package. The photonic package is disposed over a circuit substrate, and the photonic package is electrically connected to the circuit substrate. The formation of the photonic die includes forming a plurality of waveguides and a plurality of dielectric layers, each of the waveguides is surrounded by a respective dielectric layer, and one or more of the waveguides are formed with optimal bend portions having gradual curvatures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a photonic package including an electronic die and a photonic die bonded to each other, the photonic die comprising:
       a plurality of waveguides, each laterally surrounded by a respective dielectric layer; and
       a first redistribution structure disposed over the waveguides and the dielectric layers, wherein at least one of the waveguides includes a meandering portion, the meandering portion includes two straight segments and a bend segment with a gradual curvature, and the bend segment is in a semi-elliptical arc shape with a semi-minor axis and a semi-major axis.

2. The semiconductor package of claim 1, wherein the two straight segments are parallel to each other and connected to each other through the bend segment.

3. The semiconductor package of claim 1, wherein a parallel distance between two straight segments is substantially equal to twice the semi-minor axis.

4. The semiconductor package of claim 3, wherein the parallel distance ranges from about 1 μm to about 1000 μm.

5. The semiconductor package of claim 1, wherein the bend segment is symmetrical along the semi-major axis.

6. The semiconductor package of claim 1, wherein the photonic die further comprising a dielectric structure adjacent to the first redistribution structure and over the waveguides and the dielectric layers.

7. The semiconductor package of claim 1, wherein a material of the waveguides includes silicon or silicon nitride.

8. The semiconductor package of claim 7, wherein a material of the dielectric layers includes silicon oxide.

9. The semiconductor package of claim 1, wherein pads of the photonic die are bonded to the pads of the electronic die.

10. The semiconductor package of claim 1, further comprising:

a second and a third redistribution structures disposed on opposite sides of the photonic package;

an insulating encapsulant disposed between the second and the third redistribution structures and surrounding the photonic package; and a plurality of through vias extending through the insulating encapsulant, wherein the second and the third redistribution structures are electrically connected through the through vias.

11. A semiconductor package, comprising:

a circuit substrate; and a photonic package disposed over the circuit substrate, the photonic package including a die stack of an electronical die and a photonic die, wherein a waveguide in the photonic die includes a pair of parallel line portions and an optimal bend portion connecting the pair of parallel line portions, the optimal bend portion has a semi-minor axis and a semi-major axis, a curvature of the optimal bend portion is gradually varied, and the optimal bend portion is of a semi-elliptical arc shape.

12. The semiconductor package of claim 11, wherein a material of the waveguide includes silicon, and a width of the waveguide ranges from about 100 nm to about 3000 nm.

13. The semiconductor package of claim 11, wherein a material of the waveguide includes silicon nitride, and a width of the waveguide ranges from about 500 nm to about 3000 nm.

14. The semiconductor package of claim 11, further comprising an interposer disposed between the circuit substrate and the photonic package, wherein the photonic package is electrically connected to the circuit substrate through the interposer.

15. The semiconductor package of claim 11, wherein the photonic die comprises a redistribution structure disposed over the waveguide, and the redistribution structure includes conductive pads that are in contact with conductive pads of the electronical die.

16. The semiconductor package of claim 11, wherein the photonic die comprises a grating coupler and a photonic component respectively adjacent to and integrated with the waveguide.

17. The semiconductor package of claim 11, wherein a parallel distance between the pair of parallel line portions ranges from about 1 μm to about 1000 μm.

18. A method for forming a semiconductor package, comprising:

forming an electronical die and forming a photonic die;

bonding the electronical die to the photonic die through a pad-to-pad hybrid bonding process to form a photonic package; and disposing the photonic package over a circuit substrate, the photonic package being electrically connected to the circuit substrate, wherein forming the photonic die comprises forming a plurality of waveguides and a plurality of dielectric layers, each of the waveguides is surrounded by a respective dielectric layer, and one of the waveguides is formed with a pair of parallel line portions and an optimal bend portion connecting the pair of parallel line portions, the optimal bend portion has a semi-minor axis and a semi-major axis, a curvature of the optimal bend portion is gradually varied, and the optimal bend portion is of a semi-elliptical arc shape.

19. The method of claim 18, further comprising disposing the photonic package over an interposer before disposing over the circuit substrate, the interposer is in between of the photonic package and the circuit substrate.

20. The method of claim 18, wherein a parallel distance between the pair of parallel line portions ranges from about 1 μm to about 1000 μm.

* * * * *